United States Patent
Hara et al.

(10) Patent No.: US 12,358,259 B2
(45) Date of Patent: Jul. 15, 2025

(54) FILM AND LAMINATE

(71) Applicant: FUJIFILM Corporation, Tokyo (JP)

(72) Inventors: Miyoko Hara, Kanagawa (JP); Yasuyuki Sasada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/898,649

(22) Filed: Sep. 26, 2024

(65) Prior Publication Data

US 2025/0034424 A1 Jan. 30, 2025

Related U.S. Application Data

(63) Continuation of application No. PCT/JP2023/013431, filed on Mar. 30, 2023.

(30) Foreign Application Priority Data

Mar. 31, 2022 (JP) .................. 2022-060848

(51) Int. Cl.
*B32B 5/16* (2006.01)
*B32B 5/02* (2006.01)
*B32B 5/30* (2006.01)

(52) U.S. Cl.
CPC ............. *B32B 5/16* (2013.01); *B32B 5/02* (2013.01); *B32B 5/30* (2013.01); *B32B 2305/55* (2013.01); *B32B 2367/00* (2013.01)

(58) Field of Classification Search
CPC .... B32B 5/16; B32B 5/02; B32B 5/30; B32B 2305/55; B32B 2367/00
USPC ...................................................... 428/209
See application file for complete search history.

(56) References Cited

U.S. PATENT DOCUMENTS

| 2014/0231123 | A1  | 8/2014 | Onodera et al. |
| 2018/0242448 | A1  | 8/2018 | Yoshikawa et al. |
| 2020/0198310 | A1* | 6/2020 | Kasai ............... C08J 5/18 |
| 2024/0262984 | A1* | 8/2024 | Sawaki ............. C08K 5/134 |
| 2025/0034424 | A1* | 1/2025 | Hara ................ B32B 15/08 |

FOREIGN PATENT DOCUMENTS

| JP | 2003062942 | 3/2003 |
| JP | 2019199612 | 11/2019 |
| WO | 2013065453 | 5/2013 |

OTHER PUBLICATIONS

"International Search Report (Form PCT/ISA/210) of PCT/JP2023/013431", mailed on May 30, 2023, with English translation thereof, pp. 1-5.
"Written Opinion of the International Searching Authority (Form PCT/ISA/237) of PCT/JP2023/013431", mailed on May 30, 2023, with English translation thereof, pp. 1-8.

* cited by examiner

*Primary Examiner* — Betelhem Shewareged
(74) *Attorney, Agent, or Firm* — JCIPRNET

(57) ABSTRACT

An embodiment of the present invention relates to a film including a layer A, and a layer B provided on at least one surface of the layer A, in which a dielectric loss tangent of the film is 0.010 or less, and a ratio of an absorbance of the layer B at a wavelength of 355 nm to an absorbance of the layer A at a wavelength of 355 nm is 0.45 or more and 1.00 or less, and a laminate including a film having a layer A and a layer B, and a metal layer or a metal wire on a B layer side of the film, in which a dielectric loss tangent of the film is 0.010 or less, and a ratio of an absorbance of the layer B at a wavelength of 355 nm to an absorbance of the layer A at a wavelength of 355 nm is 0.45 or more and 1.00 or less.

13 Claims, No Drawings

FILM AND LAMINATE

CROSS-REFERENCE TO RELATED APPLICATIONS

This application is a continuation application of International Application No. PCT/JP2023/013431, filed Mar. 30, 2023, the disclosure of which is incorporated herein by reference in its entirety. Further, this application claims priority from Japanese Patent Application No. 2022-060848, filed Mar. 31, 2022, the disclosure of which is incorporated herein by reference in its entirety.

BACKGROUND OF THE INVENTION

1. Field of the Invention

The present disclosure relates to a film and a laminate.

2. Description of the Related Art

In recent years, frequencies used in a communication equipment tend to be extremely high. In order to suppress transmission loss in a high frequency band, insulating materials used in a circuit board are required to have a lowered relative permittivity and a lowered dielectric loss tangent.

In the related art, polyimide is commonly used as the insulating material used in the circuit board, a liquid crystal polymer which has high heat resistance and low water absorption and is small in loss in the high frequency band has been attracted. In addition, in recent years, with the improvement of the performance of communication equipment, the size of blind vias and through-hole vias processed by multilayering or an UV laser has been reduced. Therefore, the layer for following and adhering to the circuit board is required to have excellent dielectric characteristics and excellent UV laser workability.

As a resin composition for forming a film in the related art, for example, JP2019-199612A discloses a resin composition including a styrene-based polymer, an inorganic filler, and a curing agent. The resin composition is described as satisfying Expressions (A) and (B) in a form of a film having a thickness of 25 μm, in which the styrene-based polymer is an acid-modified styrene-based polymer having a carboxyl group, the inorganic filler is silica and/or aluminum hydroxide, the particle diameter of the inorganic filler is 1 μm or less, the content of the inorganic filler is 20 to 80 parts by mass with respect to 100 parts by mass of the styrene-based polymer.

$$X \leq 50 \quad (A)$$

$$Y \geq 40 \quad (B)$$

(In the expression, X represents an absorbance (unit: %) of light having a wavelength of 355 nm, and Y represents a haze value (unit: %).)

SUMMARY OF THE INVENTION

An object to be achieved by an embodiment of the present invention is to provide a film having a low dielectric loss tangent and excellent laser processing suitability.

Further, an object to be achieved by the embodiment of the present invention is to provide a laminate formed of the film.

The methods for achieving the above-described objects include the following aspects.

<1> A film including a layer A; and a layer B provided on at least one surface of the layer A, in which a dielectric loss tangent of the film is 0.010 or less, and a ratio of an absorbance of the layer B at a wavelength of 355 nm to an absorbance of the layer A at the wavelength of 355 nm is 0.45 or more and 1.00 or less.

<2> The film according to <1>, in which a ratio of an elastic modulus of the layer A at 160° C. to an elastic modulus of the layer B at 160° C. is 1.2 or more.

<3> The film according to <1> or <2>, in which an elastic modulus of the layer B at 160° C. is 100 MPa or less.

<4> The film according to any one of <1> to <3>, in which a dielectric loss tangent of the layer A is 0.01 or less.

<5> The film according to any one of <1> to <4>, in which the layer A contains a liquid crystal polymer.

<6> The film according to any one of <1> to <5>, in which the layer A contains aromatic polyester amide.

<7> The film according to any one of <1> to <6>, in which a dielectric loss tangent of the layer B is 0.01 or less.

<8 The film according to any one of <1> to <7>, in which the layer B contains a compound having a weight-average molecular weight of 5,000 or more and an absorbance of 80% or more at the wavelength of 355 nm.

<9> The film according to any one of <1> to <8>, in which the layer B contains a liquid crystal polymer.

<10> The film according to any one of <1> to <9>, in which the layer B contains aromatic polyester amide.

<11> The film according to any one of <1> to <10>, in which the layer B contains a thermoplastic resin having a constitutional unit having an aromatic hydrocarbon group.

<12> A laminate including: the film according to any one of <1> to <11>; and a metal layer or a metal wire disposed on at least one surface of the film.

<13> A laminate including a film having a layer A and a layer B; and a metal layer or a metal wire on a B layer side of the film, in which a dielectric loss tangent of the film is 0.010 or less, and a ratio of an absorbance of the layer B at a wavelength of 355 nm to an absorbance of the layer A at the wavelength of 355 nm is 0.45 or more and 1.00 or less.

According to the embodiment of the present invention, it is possible to provide a film having a low dielectric loss tangent and excellent laser processing suitability.

Further, according to another aspect of the present invention, it is possible to provide a laminate formed of the film.

DESCRIPTION OF THE PREFERRED EMBODIMENTS

Hereinafter, the contents of the present disclosure will be described in detail. The description of configuration requirements below is made based on representative embodiments of the present disclosure in some cases, but the present disclosure is not limited to such embodiments.

Further, in the present specification, a numerical range shown using "to" indicates a range including numerical values described before and after "to" as a lower limit and an upper limit.

In a numerical range described in a stepwise manner in the present disclosure, an upper limit or a lower limit described in one numerical range may be replaced with an upper limit or a lower limit in another numerical range described in a stepwise manner. Further, in a numerical range described in the present disclosure, an upper limit or a lower limit described in the numerical range may be replaced with a value described in an example.

Further, in a case where substitution or unsubstitution is not noted in regard to the notation of a "group" (atomic group) in the present specification, the "group" includes not only a group that does not have a substituent but also a group having a substituent. For example, the concept of an "alkyl group" includes not only an alkyl group that does not have a substituent (unsubstituted alkyl group) but also an alkyl group having a substituent (substituted alkyl group).

In the present specification, the concept of "(meth)acryl" includes both acryl and methacryl, and the concept of "(meth)acryloyl" includes both acryloyl and methacryloyl.

Further, the term "step" in the present specification indicates not only an independent step but also a step which cannot be clearly distinguished from other steps as long as the intended purpose of the step is achieved.

Further, in the present disclosure, "% by mass" has the same definition as that for "% by weight", and "part by mass" has the same definition as that for "part by weight".

Furthermore, in the present disclosure, a combination of two or more preferred embodiments is a more preferred embodiment.

Further, the weight-average molecular weight (Mw) and the number-average molecular weight (Mn) in the present disclosure are molecular weights converted using polystyrene as a standard substance by performing detection with a gel permeation chromatography (GPC) analysis apparatus using TSKgel SuperHM-H (trade name, manufactured by Tosoh Corporation) column, a solvent of pentafluorophenol (PFP) and chloroform at a mass ratio of 1:2, and a differential refractometer, unless otherwise specified.

Hereinafter, the present disclosure will be described in detail.

(Film)

The film according to the embodiment of the present disclosure includes a layer A, and a layer B provided on at least one surface of the layer A, in which a dielectric loss tangent of the film is 0.010 or less, and a ratio of an absorbance of the layer B at a wavelength of 355 nm to an absorbance of the layer A at a wavelength of 355 nm is 0.45 or more and 1.00 or less.

In addition, it is preferable that the layer A is an insulating material layer and the layer B is a layer for following and adhering to a circuit board.

The present inventors have found that the film in the related art, which has a low dielectric loss tangent and has two or more layers, has a problem in laser processing suitability. The "laser processing suitability" in the present disclosure is suitability for cutting processing by a laser. Specifically, the "laser ablation resistance" is a characteristic of being able to reduce excessive cutting by a laser in a case where the through-hole processing is performed. It can be said that the above-described excellent characteristics are excellent in processability of a cutting portion in laser processing into a desired shape.

In the film according to the embodiment of the present disclosure, the film includes a layer A, and a layer B provided on at least one surface of the layer A, in which a dielectric loss tangent of the film is 0.010 or less, and a ratio of an absorbance of the layer B at a wavelength of 355 nm to an absorbance of the layer A at a wavelength of 355 nm is 0.45 or more and 1.00 or less, and thus, it is possible to suppress a difference in UV absorbency of a laser between the layer A and the layer B and suppress overcutting of the layer A and the layer B by the laser even in a case where the film has a low dielectric loss tangent. As a result, it is possible to provide a film having a low dielectric loss tangent and excellent laser processing suitability.

<Dielectric Loss Tangent of Film>

The dielectric loss tangent of the film according to the embodiment of the present disclosure is 0.010 or less, and from the viewpoint of the dielectric loss tangent of the film and the laser processing suitability, it is preferably 0.005 or less, more preferably 0.004 or less, and particularly preferably 0.003 or less. The lower limit values of both cases are not particularly set, and examples thereof include a value of more than 0.

The dielectric loss tangent in the present disclosure is measured by the following method.

The dielectric loss tangent is measured by a resonance perturbation method at a frequency of 10 GHz. A 10 GHz cavity resonator (CP531 manufactured by KANTO Electronic Application and Development Inc.) is connected to a network analyzer ("E8363B" manufactured by Agilent Technology Co., Ltd.), a test piece is inserted into the cavity resonator, and the dielectric loss tangent of the film is measured from change in resonance frequency before and after insertion for 96 hours under an environment of a temperature of 25° C. and humidity of 60% RH.

In a case where each layer is measured, an unnecessary layer may be scraped off with a razor or the like to produce an evaluation sample of only the target layer. In addition, in a case where it is difficult to take out the single film because the thickness of the layer is thin, a layer to be measured may be scraped off with a razor or the like, and the obtained powdery sample may be used. In the present disclosure, the measurement of the dielectric loss tangent of the polymer is carried out according to the above-described method of measuring a dielectric loss tangent by identifying or isolating a chemical structure of the polymer constituting each layer and using a powdered sample of the polymer to be measured.

<Absorbance Ratio at Wavelength of 355 nm>

In the film according to the embodiment of the present disclosure, a ratio of an absorbance of the layer B at a wavelength of 355 nm to an absorbance of the layer A at a wavelength of 355 nm (an absorbance of the layer B/an absorbance of the layer A) is 0.45 or more and 1.00 or less. In a case where the ratio of the above-described absorbances is 0.45 or more, a difference in cutting amount between the layer A and the layer B by the laser during the laser processing is suppressed to be small.

In addition, in the film according to the embodiment of the present disclosure, from the viewpoint of laser processing suitability, the ratio of the absorbance of the layer B at a wavelength of 355 nm to the absorbance of the layer A at a wavelength of 355 nm is preferably 0.50 or more and 1.00 or less, more preferably 0.80 or more and less than 1.00, and particularly preferably 0.90 or more and 0.99 or less.

The absorbance at a wavelength of 355 nm in the present disclosure is measured by the following method.

First, the film is cut in cross section with a microtome to specify cross-sections of the layer A and the layer B. The cross section is subjected to cutting processing so that the optical path length is equal to the film thickness of each layer, and the total light transmittance and the reflectivity of light having a wavelength of 355 nm are measured using a microspectrophotometer. The absorption coefficient is calculated by the following calculation expression.

Absorbance (%)=100−Total light transmittance (%)−Reflectivity (%)

From the absorbance of the layer A and the absorbance of the layer B obtained above, the value of the absorbance of the layer B/the absorbance of the layer A is calculated.

<Elastic Modulus of Layer a and Layer B at 160° C.>

From the viewpoint of laser processing suitability and level difference followability, the elastic modulus of the layer A of the film according to the embodiment of the present disclosure at 160° C. is preferably in a range of 100 MPa to 2,500 MPa, more preferably in a range of 200 MPa to 2,000 MPa, still more preferably in a range of 300 MPa to 1,500 MPa, and particularly preferably in a range of 500 MPa to 1,000 MPa.

From the viewpoint of laser processing suitability and level difference followability, the elastic modulus of the layer B of the film according to the embodiment of the present disclosure at 160° C. is preferably 100 MPa or less, more preferably 10 MPa or less, still more preferably 0.001 MPa to 10 MPa, and particularly preferably 0.5 MPa to 5 MPa.

From the viewpoint of laser processing suitability and level difference followability, a ratio ($MD^A/MD^B$) of the elastic modulus $MD^A$ of the layer A at 160° C. to the elastic modulus $MD^B$ of the layer B at 160° C. in the film according to the embodiment of the present disclosure is preferably 1.2 or more, more preferably 5 to 1,000, still more preferably 10 to 500, and particularly preferably 100 to 400.

The elastic modulus in the present disclosure is measured by the following method.

First, the film or the laminate is cut in cross section with a microtome or the like, and the layer A or the layer B is specified from an image observed with an optical microscope. Next, the elastic modulus of the specified layer A or layer B was measured as an indentation elastic modulus using a nanoindentation method. The indentation elastic modulus is measured by using a microhardness tester (product name "DUH-W201", manufactured by Shimadzu Corporation) to apply a load at a loading rate of 0.28 mN/sec with a Vickers indenter at 160° C., holding a maximum load of 10 mN for 10 seconds, and then unloading at a loading rate of 0.28 mN/sec.

The measurement is also performed in the layers other than the layer A and the layer B. In addition, in a case where each layer is measured, an unnecessary layer may be scraped off with a razor or the like to produce an evaluation sample of only the target layer. In addition, in a case where it is difficult to take out the single film because the thickness of the layer is thin, a layer to be measured may be scraped off with a razor or the like, and the obtained powdery sample may be used.

<Layer A>

The film according to the embodiment of the present disclosure has a layer A.

Further, examples of a method for detecting or determining the layer configuration, the thickness of each layer, and the like in the film include the following methods.

First, a cross-sectional sample of the polymer film is cut out by a microtome, and a layer configuration and a thickness of each layer are determined with an optical microscope. In a case where the determination with an optical microscope is difficult, the determination may be obtained by performing morphological observation with a scanning electron microscope (SEM), component analysis with a time-of-flight secondary ion mass spectrometry (TOF-SIMS), or the like.

From the viewpoints of the dielectric loss tangent of the film, the laser processing suitability, and the level difference followability, the dielectric loss tangent of the layer A is preferably 0.01 or less, more preferably 0.005 or less, still more preferably 0.004 or less, and particularly preferably 0.003 or less. The lower limit values of both cases are not particularly set, and examples thereof include a value of more than 0.

From the viewpoint of the dielectric loss tangent of the film and the laser processing suitability, the layer A preferably contains a polymer having a dielectric loss tangent of 0.01 or less.

In addition, from the viewpoint of the dielectric loss tangent of the film and the laser processing suitability, the layer A preferably contains a polymer having an aromatic ring, and more preferably contains a polymer having an aromatic ring and having a dielectric loss tangent of 0.01 or less.

Further, from the viewpoint of the dielectric loss tangent of the film and the laser processing suitability, the layer A preferably contains a polymer and polymer particles, and more preferably contains a polymer having a dielectric loss tangent of 0.01 or less and particles of a polymer having a dielectric loss tangent of 0.01 or less.

[Polymer Having Dielectric Loss Tangent of 0.01 or Less]

From the viewpoints of the dielectric loss tangent of the film, the laser processing suitability, and the level difference followability, the dielectric loss tangent of the polymer contained in the layer A of the film according to the embodiment of the present disclosure is preferably 0.01 or less, more preferably 0.005 or less, still more preferably 0.004 or less, and particularly preferably 0.003 or less. The lower limit values of both cases are not particularly set, and examples thereof include a value of more than 0.

From the viewpoints of the dielectric loss tangent of the film, the adhesiveness of the film to the metal (for example, the metal layer, the metal wire, or the like), and the heat resistance, the melting point Tm or the 5% by mass reduced temperature Td of the polymer having a dielectric loss tangent of 0.01 or less is preferably 200° C. or higher, more preferably 250° C. or higher, still more preferably 280° C. or higher, and particularly preferably 300° C. or higher. The upper limit value thereof is not particularly limited, but is preferably 500° C. or lower and more preferably 420° C. or lower.

The melting point Tm in the present disclosure is defined as a value measured by a differential scanning calorimetry (DSC) device. 5 mg of a sample is put into a measurement pan of the DSC, and a peak temperature of an endothermic peak which appears in a case where the sample is heated from 30° C. at 10° C./min in a nitrogen stream is defined as the Tm of the film.

In addition, the 5%-by-mass-loss temperature Td in the present disclosure is measured with a thermogravimetric analysis (TGA) device. That is, a weight of the sample put into the measurement pan is defined as an initial value, and a temperature at which the weight is reduced by 5% by mass with respect to the initial value due to the heating is defined as the 5%-by-mass-loss temperature Td.

From the viewpoints of the dielectric loss tangent of the film, the adhesiveness to the metal, and the heat resistance, the glass transition temperature Tg of the polymer having a dielectric loss tangent of 0.01 or less is preferably 150° C. or higher, more preferably 200° C. or higher, and particularly preferably 200° C. or higher. The upper limit value thereof is not particularly limited, but is preferably lower than 350° C., more preferably 280° C. or lower, and particularly preferably less than 280° C.

The glass transition temperature Tg in the present disclosure is defined as a value measured by a differential scanning calorimetry (DSC) device.

A weight-average molecular weight Mw of the polymer having a dielectric loss tangent of 0.01 or less is preferably 1,000 or more, more preferably 2,000 or more, and particularly preferably 5,000 or more. In addition, the weight-average molecular weight Mw of the polymer having a dielectric loss tangent of 0.01 or less is preferably 50,000 or less, more preferably 20,000 or less, and particularly preferably less than 13,000.

In the present disclosure, the type of the polymer having a dielectric loss tangent of 0.01 or less is not particularly limited, and a known polymer can be used.

Examples of the polymer having a dielectric loss tangent of 0.01 or less include thermoplastic resins such as a liquid crystal polymer, a fluorine-based polymer, a polymerized substance of a compound which has a cyclic aliphatic hydrocarbon group and a group having an ethylenically unsaturated bond, polyether ether ketone, polyolefin, polyamide, polyester, polyphenylene sulfide, aromatic polyether ketone, polycarbonate, polyethersulfone, polyphenylene ether and a modified product thereof, and polyetherimide; elastomers such as a copolymer of glycidyl methacrylate and polyethylene; and thermosetting resins such as a phenol resin, an epoxy resin, a polyimide resin, and a cyanate resin.

Among these, from the viewpoint of dielectric loss tangent of the film, adhesiveness to metal, and heat resistance, at least one polymer selected from the group consisting of a liquid crystal polymer, a fluorine-based polymer, a polymerized substance of a compound which has a cyclic aliphatic hydrocarbon group and a group having an ethylenically unsaturated bond, polyphenylene ether, and aromatic polyether ketone is preferable, and at least one polymer selected from the group consisting of a liquid crystal polymer and a fluorine-based polymer is more preferable.

From the viewpoint of adhesiveness and mechanical strength of the film, a liquid crystal polymer is preferable, and from the viewpoint of heat resistance and dielectric loss tangent, a fluorine-based polymer is preferable.

—Liquid Crystal Polymer—

From the viewpoints of the dielectric loss tangent of the film, the laser processing suitability, and the level difference followability, the layer A in the film according to the embodiment of the present disclosure preferably includes a liquid crystal polymer.

In the present disclosure, the type of the liquid crystal polymer is not particularly limited, and a known liquid crystal polymer can be used.

In addition, the liquid crystal polymer may be a thermotropic liquid crystal polymer which exhibits liquid crystallinity in a molten state, or may be a lyotropic liquid crystal polymer which exhibits liquid crystallinity in a solution state. Further, in a case where the liquid crystal polymer is a thermotropic liquid crystal polymer, the liquid crystal polymer is preferably a liquid crystal polymer which is molten at a temperature of 450° C. or lower.

Examples of the liquid crystal polymer include a liquid crystal polyester, a liquid crystal polyester amide in which an amide bond is introduced into the liquid crystal polyester, a liquid crystal polyester ether in which an ether bond is introduced into the liquid crystal polyester, and a liquid crystal polyester carbonate in which a carbonate bond is introduced into the liquid crystal polyester.

In addition, from the viewpoints of the dielectric loss tangent, the liquid crystallinity, and the thermal expansion coefficient of the film, the liquid crystal polymer is preferably a polymer having an aromatic ring, more preferably an aromatic polyester or an aromatic polyester amide, and particularly preferably an aromatic polyester amide.

Further, the liquid crystal polymer may be a polymer in which an imide bond, a carbodiimide bond, a bond derived from an isocyanate, such as an isocyanurate bond, or the like is further introduced into the aromatic polyester or the aromatic polyester amide.

Further, it is preferable that the liquid crystal polymer is a wholly aromatic liquid crystal polymer formed of only an aromatic compound as a raw material monomer.

Examples of the liquid crystal polymer include the following liquid crystal polymers.

1) a liquid crystal polymer obtained by polycondensing (i) an aromatic hydroxycarboxylic acid, (ii) an aromatic dicarboxylic acid, and (iii) at least one compound selected from the group consisting of an aromatic diol, an aromatic hydroxyamine, and an aromatic diamine;
2) a liquid crystal polymer obtained by polycondensing a plurality of types of aromatic hydroxycarboxylic acids;
3) a liquid crystal polymer obtained by polycondensing (i) an aromatic dicarboxylic acid and (ii) at least one compound selected from the group consisting of an aromatic diol, an aromatic hydroxyamine, and an aromatic diamine;
4) a liquid crystal polymer obtained by polycondensing (i) polyester such as polyethylene terephthalate and (ii) an aromatic hydroxycarboxylic acid.

Here, the aromatic hydroxycarboxylic acid, the aromatic dicarboxylic acid, the aromatic diol, the aromatic hydroxyamine, and the aromatic diamine may be each independently replaced with a polycondensable derivative.

For example, the aromatic hydroxycarboxylic acid and the aromatic dicarboxylic acid can be replaced with aromatic hydroxycarboxylic acid ester and aromatic dicarboxylic acid ester, by converting a carboxy group into an alkoxycarbonyl group or an aryloxycarbonyl group.

The aromatic hydroxycarboxylic acid and the aromatic dicarboxylic acid can be replaced with aromatic hydroxycarboxylic acid halide and aromatic dicarboxylic acid halide, by converting a carboxy group into a haloformyl group.

The aromatic hydroxycarboxylic acid and the aromatic dicarboxylic acid can be replaced with aromatic hydroxycarboxylic acid anhydride and aromatic dicarboxylic acid anhydride, by converting a carboxy group into an acyloxycarbonyl group.

Examples of a polymerizable derivative of a compound having a hydroxy group, such as an aromatic hydroxycarboxylic acid, an aromatic diol, and an aromatic hydroxyamine, include a derivative (acylated product) obtained by acylating a hydroxy group and converting the acylated group into an acyloxy group.

For example, the aromatic hydroxycarboxylic acid, the aromatic diol, and the aromatic hydroxyamine can be each replaced with an acylated product by acylating a hydroxy group and converting the acylated group into an acyloxy group.

Examples of a polymerizable derivative of a compound having an amino group, such as an aromatic hydroxyamine or an aromatic diamine, include a derivative (acylated product) obtained by acylating an amino group and converting the acylated group to an acylamino group.

For example, the aromatic hydroxyamine and the aromatic diamine can be each replaced with an acylated product by acylating an amino group and converting the acylated group into an acylamino group.

From the viewpoint of liquid crystallinity, dielectric loss tangent of the film, and adhesiveness to the metal, the liquid crystal polymer preferably has a constitutional unit represented by any of Formulae (1) to (3) (hereinafter, a constitutional unit represented by Formula (1) or the like may be referred to as a constitutional unit (1) or the like), more preferably has a constitutional unit represented by Formula (1), and particularly preferably has a constitutional unit represented by Formula (1), a constitutional unit represented by Formula (2), and a constitutional unit represented by Formula (3).

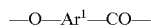   Formula (1)

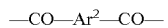   Formula (2)

   Formula (3)

in Formulae (1) to (3), $Ar^1$ represents a phenylene group, a naphthylene group, or a biphenylylene group, $Ar^2$ and $Ar^3$ each independently represent a phenylene group, a naphthylene group, a biphenylylene group, or a group represented by Formula (4), X and Y each independently represent an oxygen atom or an imino group, and hydrogen atoms in $Ar^1$ to $Ar^3$ may be each independently substituted with a halogen atom, an alkyl group, or an aryl group,

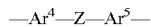   Formula (4)

in Formula (4), $Ar^4$ and $Ar^5$ each independently represent a phenylene group or a naphthylene group, and Z represents an oxygen atom, a sulfur atom, a carbonyl group, a sulfonyl group, or an alkylene group.

Examples of the halogen atom include a fluorine atom, a chlorine atom, a bromine atom, and an iodine atom.

Examples of the alkyl group include a methyl group, an ethyl group, an n-propyl group, an isopropyl group, an n-butyl group, an isobutyl group, an s-butyl group, a t-butyl group, an n-hexyl group, a 2-ethylhexyl group, an n-octyl group, and an n-decyl group. The number of carbon atoms in the alkyl group is preferably 1 to 10.

Examples of the aryl group include a phenyl group, an o-tolyl group, an m-tolyl group, a p-tolyl group, a 1-naphthyl group, and a 2-naphthyl group. The number of carbon atoms in the aryl group is preferably 6 to 20.

In a case where the hydrogen atom is substituted with any of these groups, the number of each of substitutions in $Ar^1$, $Ar^2$, and $Ar^3$ independently is preferably 2 or less and more preferably 1.

Examples of the alkylene group include a methylene group, a 1,1-ethanediyl group, a 1-methyl-1,1-ethanediyl group, a 1,1-butanediyl group, and a 2-ethyl-1,1-hexanediyl group. The number of carbon atoms in the alkylene group is preferably 1 to 10.

The constitutional unit (1) is a constitutional unit derived from an aromatic hydroxycarboxylic acid.

As the constitutional unit (1), an aspect in which $Ar^1$ represents a p-phenylene group (constitutional unit derived from p-hydroxybenzoic acid), an aspect in which $Ar^1$ represents a 2,6-naphthylene group (constitutional unit derived from 6-hydroxy-2-naphthoic acid), or an aspect in which $Ar^1$ represents a 4,4'-biphenylylene group (constitutional unit derived from 4'-hydroxy-4-biphenylcarboxylic acid) is preferable.

The constitutional unit (2) is a constitutional unit derived from an aromatic dicarboxylic acid.

As the constitutional unit (2), an aspect in which $Ar^2$ represents a p-phenylene group (constitutional unit derived from terephthalic acid), an aspect in which $Ar^2$ represents an m-phenylene group (constitutional unit derived from isophthalic acid), an aspect in which $Ar^2$ represents a 2,6-naphthylene group (constitutional unit derived from 2,6-naphthalenedicarboxylic acid), or an aspect in which $Ar^2$ represents a diphenylether-4,4'-diyl group (constitutional unit derived from diphenylether-4,4'-dicarboxylic acid) is preferable.

The constitutional unit (3) is a constitutional unit derived from an aromatic diol, an aromatic hydroxylamine, or an aromatic diamine.

As the constitutional unit (3), an aspect in which $Ar^3$ represents a p-phenylene group (constitutional unit derived from hydroquinone, p-aminophenol, or p-phenylenediamine), an aspect in which $Ar^3$ represents an m-phenylene group (constitutional unit derived from isophthalic acid), or an aspect in which $Ar^3$ represents a 4,4'-biphenylylene group (constitutional unit derived from n 4,4'-dihydroxybiphenyl, 4-amino-4'-hydroxybiphenyl, or 4,4'-diaminobiphenyl) is preferable.

A content of the constitutional unit (1) is preferably 30% by mole or more, more preferably 30% to 80% by mole, still more preferably 30% to 60% by mole, and particularly preferably 30% to 40% by mole with respect to the total amount of all constitutional units (a value obtained by dividing the mass of each constitutional unit (also referred to as "monomer unit") constituting the liquid crystal polymer by the formula weight of each constitutional unit to calculate an amount (mole) equivalent to the substance amount of each constitutional unit and adding up the amounts).

The content of the constitutional unit (2) is preferably 35% by mole or less, more preferably 10% by mole to 35% by mole, still more preferably 20% by mole to 35% by mole, and particularly preferably 30% by mole to 35% by mole with respect to the total amount of all constitutional units.

The content of the constitutional unit (3) is preferably 35% by mole or less, more preferably 10% by mole to 35% by mole, still more preferably 20% by mole to 35% by mole, and particularly preferably 30% by mole to 35% by mole with respect to the total amount of all constitutional units.

The heat resistance, the strength, and the rigidity are likely to be improved as the content of the constitutional unit (1) increases, but the solubility in a solvent is likely to be decreased in a case where the content thereof is extremely large.

A proportion of the content of the constitutional unit (2) to the content of the constitutional unit (3) is expressed as [content of constitutional unit (2)]/[content of constitutional unit (3)] (mol/mol), and is preferably 0.9/1 to 1/0.9, more preferably 0.95/1 to 1/0.95, and still more preferably 0.98/1 to 1/0.98.

The liquid crystal polymer may have two or more kinds of each of the constitutional units (1) to (3) independently. In addition, the liquid crystal polymer may have a constitutional unit other than the units (1) to (3). A content of the constitutional unit other than the constitutional units (1) to (3) is preferably 10% by mole or less and more preferably 5% by mole or less with respect to the total amount of all constitutional units.

From the viewpoint of solubility in a solvent, the liquid crystal polymer preferably has, as the constitutional unit (3), a constitutional unit (3) in which at least one of X or Y is an imino group. That is, the constitutional unit (3) preferably has at least one of a constitutional unit derived from an aromatic hydroxylamine or a constitutional unit derived from an aromatic diamine, and more preferably has only the constitutional unit (3) in which at least one of X or Y represents an imino group.

It is preferable that the liquid crystal polymer is produced by melt-polymerizing raw material monomers corresponding to the constitutional units constituting the liquid crystal polymer. The melt polymerization may be carried out in the presence of a catalyst. Examples of the catalyst include metal compounds such as magnesium acetate, stannous acetate, tetrabutyl titanate, lead acetate, sodium acetate, potassium acetate, and antimony trioxide, and nitrogen-containing heterocyclic compounds such as 4-(dimethylamino)pyridine and 1-methylimidazole; and preferred examples thereof include nitrogen-containing heterocyclic compounds. The melt polymerization may be further carried out by solid phase polymerization as necessary.

The lower limit value of the flow start temperature of the liquid crystal polymer is preferably 180° C. or higher, more preferably 200° C. or higher, and still more preferably 250° C. or higher. The upper limit value of the flow start temperature is preferably 350° C., more preferably 330° C., and still more preferably 310° C. In a case where the flow start temperature of the liquid crystal polymer is within the above-described range, the solubility, the heat resistance, the strength, and the rigidity are excellent, and the viscosity of the solution is appropriate.

The flow start temperature is also referred to as a flow temperature or a fluidity temperature. The flow start temperature is a temperature at which a viscosity of 4,800 Pas (48,000 poise) is exhibited in a case where the liquid crystal polymer is melted and extruded from a nozzle having an inner diameter of 1 mm and a length of 10 mm while being heated at a rate of 4° C./min under a load of 9.8 MPa (100 kg/cm$^2$) using a capillary rheometer. The flow start temperature is a guide for the molecular weight of the liquid crystal polymer (see "Liquid Crystal Polymer-Synthesis, Forming, and Application-", edited by Naoyuki Koide, CMC Publishing Co., Ltd., Jun. 5, 1987, p. 95).

In addition, a weight-average molecular weight of the liquid crystal polymer is preferably 1,000,000 or less, more preferably 3,000 to 300,000, still more preferably 5,000 to 100,000, and particularly preferably 5,000 to 30,000. In a case where the weight-average molecular weight of the liquid crystal polymer is within the above-described range, a film after heat treatment is excellent in thermal conductivity, heat resistance, strength, and rigidity in the thickness direction.

—Fluorine-Based Polymer—

From the viewpoint of heat resistance and mechanical strength, the polymer having a dielectric loss tangent of 0.01 or less is preferably a fluorine-based polymer.

In the present disclosure, the type of the fluorine-based polymer used as the polymer having a dielectric loss tangent of 0.01 or less is not particularly limited as long as the dielectric loss tangent thereof is 0.01 or less, and a known fluorine-based polymer can be used.

Examples of the fluorine-based polymer include polytetrafluoroethylene, polychlorotrifluoroethylene, polyvinylidene fluoride, polyvinyl fluoride, a perfluoroalkoxy fluororesin, an ethylene tetrafluoride/propylene hexafluoride copolymer, an ethylene/ethylene tetrafluoride copolymer, and an ethylene/chlorotrifluoroethylene copolymer.

Among these, polytetrafluoroethylene is preferable.

In addition, examples of the fluorine-based polymer include a fluorinated α-olefin monomer, that is, an α-olefin monomer containing at least one fluorine atom; and a homopolymer and a copolymer optionally containing a constitutional unit derived from a non-fluorinated ethylenically unsaturated monomer reactive to the fluorinated α-olefin monomer.

Examples of the fluorinated α-olefin monomer include $CF_2$=$CF_2$, $CHF$=$CF_2$, $CH_2$=$CF_2$, $CHCl$=$CHF$, $CClF$=$CF_2$, $CCl_2$=$CF_2$, $CClF$=$CClF$, $CHF$=$CCl_2$, $CH_2$=$CClF$, $CCl_2$=$CClF$, $CF_3CF$=$CF_2$, $CF_3CF$=$CHF$, $CF_3CH$=$CF_2$, $CF_3CH$=$CH_2$, $CHF_2CH$=$CHF$, $CF_3CF$=$CF_2$, and perfluoro (alkyl having 2 to 8 carbon atoms) vinyl ether (for example, perfluoromethyl vinyl ether, perfluoropropyl vinyl ether, and perfluorooctyl vinyl ether). Among these, at least one monomer selected from the group consisting of tetrafluoroethylene ($CF_2$=$CF_2$), chlorotrifluoroethylene ($CClF$=$CF_2$), (perfluorobutyl)ethylene, vinylidene fluoride ($CH_2$=$CF_2$), and hexafluoropropylene ($CF_2$=$CFCF_3$) is preferable.

Examples of the non-fluorinated monoethylenically unsaturated monomer include ethylene, propylene, butene, and an ethylenically unsaturated aromatic monomer (for example, styrene and α-methylstyrene).

The fluorinated α-olefin monomer may be used alone or in combination of two or more thereof.

In addition, the non-fluorinated ethylenically unsaturated monomer may be used alone or in combination of two or more thereof.

Examples of the fluorine-based polymer include polychlorotrifluoroethylene (PCTFE), poly(chlorotrifluoroethylene-propylene), poly(ethylene-tetrafluoroethylene) (ETFE), poly(ethylene-chlorotrifluoroethylene) (ECTFE), poly(hexafluoropropylene), poly(tetrafluoroethylene) (PTFE), poly(tetrafluoroethylene-ethylene-propylene), poly(tetrafluoroethylene-hexafluoropropylene) (FEP), poly(tetrafluoroethylene-propylene) (FEPM), poly(tetrafluoroethylene-perfluoropropylene vinyl ether), poly(tetrafluoroethylene-perfluoroalkyl vinyl ether) (PFA) (for example, poly(tetrafluoroethylene-perfluoropropyl vinyl ether)), polyvinyl fluoride (PVF), polyvinylidene fluoride (PVDF), poly(vinylidene fluoride-chlorotrifluoroethylene), perfluoropolyether, perfluorosulfonic acid, and perfluoropolyoxetane.

The fluorine-based polymer may be used alone or in combination of two or more thereof.

The fluorine-based polymer is preferably at least one of FEP, PFA, ETFE, or PTFE. The FEP is available from Du Pont as the trade name of TEFLON (registered trademark) FEP or from DAIKIN INDUSTRIES, LTD. as the trade name of NEOFLON FEP; and the PFA is available from DAIKIN INDUSTRIES, LTD. as the trade name of NEOFLON PFA, from Du Pont as the trade name of TEFLON (registered trademark) PFA, or from Solvay Solexis as the trade name of HYFLON PFA.

The fluorine-based polymer preferably includes PTFE. The PTFE can be included as a PTFE homopolymer, a partially modified PTFE homopolymer, or a combination including one or both of these. The partially modified PTFE homopolymer preferably contains a constitutional unit derived from a comonomer other than tetrafluoroethylene in an amount of less than 1% by mass based on the total mass of the polymer.

The fluorine-based polymer may be a crosslinkable fluoropolymer having a crosslinkable group. The crosslinkable fluoropolymer can be crosslinked by a known crosslinking method in the related art. One of the representative crosslinkable fluoropolymers is a fluoropolymer having a (meth) acryloxy group. For example, the crosslinkable fluoropolymer may be represented by Formula:

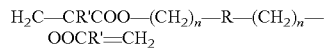

In the formula, R is a fluorine-based oligomer chain having two or more constitutional units derived from a fluorinated α-olefin monomer or a non-fluorinated monoethylenically unsaturated monomer, R' is H or —CH$_3$, and n is 1 to 4. R may be a fluorine-based oligomer chain having a constitutional unit derived from tetrafluoroethylene.

In order to initiate a radical crosslinking reaction through the (meth)acryloxy group in the fluorine-based polymer, by exposing the fluoropolymer having a (meth)acryloxy group to a free radical source, a crosslinked fluoropolymer network can be formed. The free radical source is not particularly limited, and suitable examples thereof include a photoradical polymerization initiator and an organic peroxide. Appropriate photoradical polymerization initiators and organic peroxides are well known in the art. The crosslinkable fluoropolymer is commercially available, and examples thereof include Viton B manufactured by Du Pont.

—Polymerized Substance of Compound which has Cyclic Aliphatic Hydrocarbon Group and Group Having Ethylenically Unsaturated Bond—

The polymer having a dielectric loss tangent of 0.01 or less may be a polymerized substance of a compound which has a cyclic aliphatic hydrocarbon group and a group having an ethylenically unsaturated bond.

Examples of the polymerized substance of a compound which has a cyclic aliphatic hydrocarbon group and a group having an ethylenically unsaturated bond include thermoplastic resins having a constitutional unit formed from a monomer having a cyclic olefin such as norbornene and a polycyclic norbornene-based monomer, which is also referred to as a thermoplastic cyclic olefin-based resin.

The polymerized substance of a compound which has a cyclic aliphatic hydrocarbon group and a group having an ethylenically unsaturated bond may be a ring-opened polymer of the above-described cyclic olefin, a hydrogenated product of a ring-opened copolymer using two or more cyclic olefins, or an addition polymer of a cyclic olefin and a linear olefin or aromatic compound having an ethylenically unsaturated bond such as a vinyl group. In addition, a polar group may be introduced into the polymerized substance of a compound which has a cyclic aliphatic hydrocarbon group and a group having an ethylenically unsaturated bond.

The polymerized substance of a compound which has a cyclic aliphatic hydrocarbon group and a group having an ethylenically unsaturated bond may be used alone or in combination of two or more thereof.

A ring structure of the cyclic aliphatic hydrocarbon group may be a single ring, a fused ring in which two or more rings are fused, or a crosslinked ring.

Examples of the ring structure of the cyclic aliphatic hydrocarbon group include a cyclopentane ring, a cyclohexane ring, a cyclooctane ring, an isophorone ring, a norbornane ring, and a dicyclopentane ring.

The compound which has a cyclic aliphatic hydrocarbon group and a group having an ethylenically unsaturated bond may be a monofunctional ethylenically unsaturated compound or a polyfunctional ethylenically unsaturated compound.

The number of cyclic aliphatic hydrocarbon groups in the compound which has a cyclic aliphatic hydrocarbon group and a group having an ethylenically unsaturated bond may be 1 or more, and may be 2 or more.

It is sufficient that the polymerized substance of a compound which has a cyclic aliphatic hydrocarbon group and a group having an ethylenically unsaturated bond is a polymer obtained by polymerizing at least one compound which has a cyclic aliphatic hydrocarbon group and a group having an ethylenically unsaturated bond, and it may be a polymerized substance of two or more kinds of the compound which has a cyclic aliphatic hydrocarbon group and a group having an ethylenically unsaturated bond or a copolymer with other ethylenically unsaturated compounds having no cyclic aliphatic hydrocarbon group.

In addition, the polymerized substance of a compound which has a cyclic aliphatic hydrocarbon group and a group having an ethylenically unsaturated bond is preferably a cycloolefin polymer.

—Polyphenylene Ether—

The layer A preferably contains a polyphenylene ether.

In a case where heat curing is performed after film formation, from the viewpoint of heat resistance and film-forming property, a weight-average molecular weight (Mw) of the polyphenylene ether is preferably 500 to 5,000 and more preferably 500 to 3,000. In addition, in a case where the heat curing is not performed, the weight-average molecular weight (Mw) of the polyphenylene ether is not particularly limited, but is preferably 3,000 to 100,000 and more preferably 5,000 to 50,000.

In the polyphenylene ether, from the viewpoint of dielectric loss tangent and heat resistance, the average number of molecular terminal phenolic hydroxyl groups per molecule (the number of terminal hydroxyl groups) is preferably 1 to 5 and more preferably 1.5 to 3.

The number of hydroxyl groups or the phenolic hydroxyl groups in the polyphenylene ether can be found, for example, from a standard value of a product of the polyphenylene ether. In addition, examples of the number of terminal hydroxyl groups or the number of terminal phenolic hydroxyl groups include a numerical value representing an average value of hydroxyl groups or phenolic hydroxyl groups per molecule of all polyphenylene ethers present in 1 mol of the polyphenylene ether.

The polyphenylene ether may be used alone or in combination of two or more thereof.

Examples of the polyphenylene ether include a polyphenylene ether including 2,6-dimethylphenol and at least one of bifunctional phenol or trifunctional phenol, and a compound mainly including the polyphenylene ether, such as poly(2,6-dimethyl-1,4-phenylene oxide). More specifically, for example, a compound having a structure represented by Formula (PPE) is preferable.

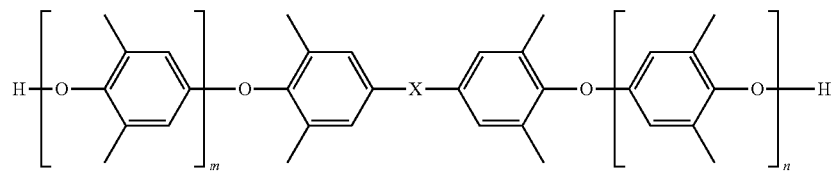

(PPE)

In Formula (PPE), X represents an alkylene group having 1 to 3 carbon atoms or a single bond, m represents an integer of 0 to 20, n represents an integer of 0 to 20, and the sum of m and n represents an integer of 1 to 30.

Examples of the alkylene group in X described above include a dimethylmethylene group.

—Aromatic Polyether Ketone—

The polymer having a dielectric loss tangent of 0.01 or less may be an aromatic polyether ketone.

The aromatic polyether ketone is not particularly limited, and a known aromatic polyether ketone can be used.

The aromatic polyether ketone is preferably a polyether ether ketone.

The polyether ether ketone is one type of the aromatic polyether ketone, and is a polymer in which bonds are arranged in the order of an ether bond, an ether bond, and a carbonyl bond (ketone). It is preferable that the bonds are linked to each other by a divalent aromatic group.

The aromatic polyether ketone may be used alone or in combination of two or more thereof.

Examples of the aromatic polyether ketone include polyether ether ketone (PEEK) having a chemical structure represented by Formula (P1), polyether ketone (PEK) having a chemical structure represented by Formula (P2), polyether ketone ketone (PEKK) having a chemical structure represented by Formula (P3), polyether ether ketone ketone (PEEKK) having a chemical structure represented by Formula (P4), and polyether ketone ether ketone ketone (PEKEKK) having a chemical structure represented by Formula (P5).

form, N,N-dimethylacetamide, γ-butyrolactone, dimethylformamide, ethylene glycol monobutyl ether, and ethylene glycol monoethyl ether.

The layer A may contain only one kind of polymer having a dielectric loss tangent of 0.01 or less, or may contain two or more kinds thereof.

From the viewpoint of the dielectric loss tangent of the film and the adhesiveness to the metal, the content of the polymer having a dielectric loss tangent of 0.01 or less, which is preferably a liquid crystal polymer, in the layer A is preferably 10% by mass to 100% by mass, more preferably 20% by mass to 100% by mass, still more preferably 30% by mass to 100% by mass, and particularly preferably 40% by mass to 100% by mass with respect to the total mass of the layer A.

From the viewpoint of dielectric loss tangent of the film and adhesiveness to the metal, the content of the polymer having a dielectric loss tangent of 0.01 or less, which is preferably a liquid crystal polymer, in the film is preferably 20% by mass to 100% by mass, more preferably 30% by mass to 100% by mass, still more preferably 40% by mass to 100% by mass, and particularly preferably 50% by mass to 100% by mass with respect to the total mass of the film.

The content of the polymer having a dielectric loss tangent of 0.01 or less also includes the content of the polymer having a particulate dielectric loss tangent of 0.01 or less, which will be described later, is.

—Filler—

The layer A may contain a filler from the viewpoint of a thermal expansion coefficient and adhesiveness to a metal.

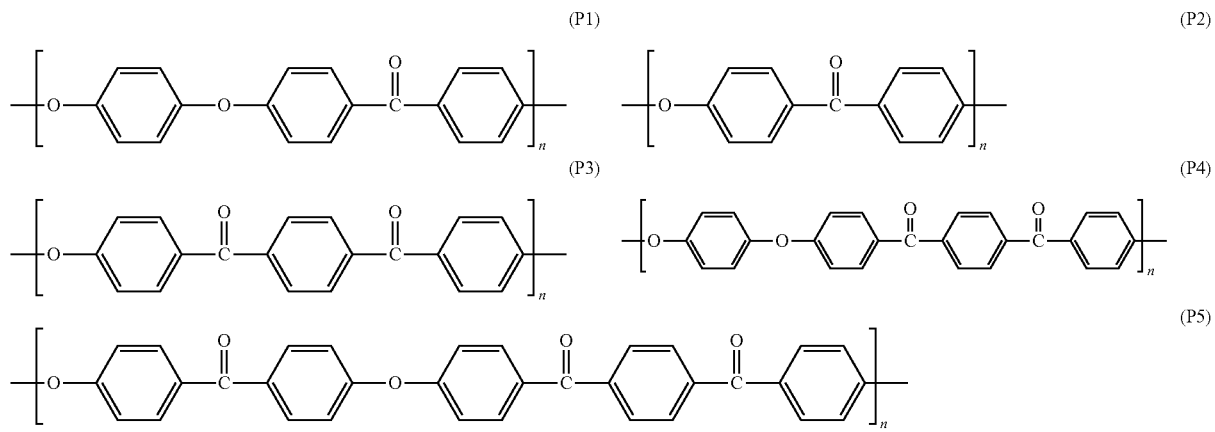

From the viewpoint of mechanical properties, each n of Formulae (P1) to (P5) is preferably 10 or more and more preferably 20 or more. On the other hand, from the viewpoint that the aromatic polyether ketone can be easily produced, n is preferably 5,000 or less and more preferably 1,000 or less. That is, n is preferably 10 to 5,000 and more preferably 20 to 1,000.

The polymer having a dielectric loss tangent of 0.01 or less is preferably a polymer soluble in a specific organic solvent (hereinafter, also referred to as "soluble polymer").

Specifically, the soluble polymer in the present disclosure is a liquid crystal polymer in which 0.1 g or more thereof is dissolved at 25° C. in 100 g of at least one solvent selected from the group consisting of N-methylpyrrolidone, N-ethylpyrrolidone, dichloromethane, dichloroethane, chloro- The filler may be particulate or fibrous, and may be an inorganic filler or an organic filler. However, from the viewpoints of the dielectric loss tangent of the film, the laser processing suitability, and the level difference followability, an organic filler is preferable.

In the film according to the embodiment of the present disclosure, from the viewpoint of the thermal expansion coefficient and the adhesiveness to the metal, the number density of the filler is preferably larger inside the film than the surface of the film.

Here, the surface of the film refers to a surface (surface in contact with air or substrate) of the film outside, and a smaller one of a range of 3 μm in a depth direction from the most surface or a range of 10% or less of the thickness of the entire film from the most surface is defined as the "surface". The inside of the film refers to a portion other than the surface of the film, that is, a surface (a surface not in contact with air or a substrate) inside the film, and is not limited, but in a range of ±1.5 μm from the center in a thickness direction of the film or in a range of ±5% of the total thickness from the center in the thickness direction of the film, one having a smaller numerical value is defined as "inside".

As the organic filler, a known organic filler can be used.

Examples of a material of the organic filler include polyethylene, polystyrene, urea-formalin filler, polyester, cellulose, acrylic resin, fluororesin, cured epoxy resin, crosslinked benzoguanamine resin, crosslinked acrylic resin, a liquid crystal polymer, and a material containing two or more kinds of these.

In addition, the organic filler may be fibrous, such as nanofibers, or may be hollow resin particles.

Among these, as the organic filler, from the viewpoint of the dielectric loss tangent of the film, the laser processing suitability, and the level difference followability, fluororesin particles, polyester-based resin particles, polyethylene particles, liquid crystal polymer particles, or cellulose-based resin nanofibers are preferable, polytetrafluoroethylene particles, polyethylene particles, or liquid crystal polymer particles are more preferable, and liquid crystal polymer particles are particularly preferable. Here, the liquid crystal polymer particles are not limited, but refer to particles obtained by polymerizing a liquid crystal polymer and crushing the liquid crystal polymer with a crusher or the like to obtain powdery liquid crystal. The liquid crystal polymer particles are preferably smaller than the thickness of each layer.

From the viewpoints of the dielectric loss tangent of the film, the laser processing suitability, and the level difference followability, the average particle diameter of the organic filler is preferably 5 nm to 20 μm and more preferably 100 nm to 10 μm.

As the inorganic filler, a known inorganic filler can be used.

Examples of a material of the inorganic filler include BN, $Al_2O_3$, AlN, $TiO_2$, $SiO_2$, barium titanate, strontium titanate, aluminum hydroxide, calcium carbonate, and a material containing two or more of these.

Among these, as the inorganic filler, from the viewpoint of thermal expansion coefficient and adhesiveness to the metal, metal oxide particles or fibers are preferable, silica particles, titania particles, or glass fibers are more preferable, and silica particles or glass fibers are particularly preferable.

An average particle diameter of the inorganic filler is preferably approximately 20% to approximately 40% of the thickness of a layer A, and for example, the average particle diameter may be selected from 25%, 30%, or 35% of the thickness of the layer A. In a case where the particles or fibers are flat, the average particle diameter indicates a length in a short side direction.

In addition, from the viewpoint of thermal expansion coefficient and adhesiveness to the metal, the average particle diameter of the inorganic filler is preferably 5 nm to 20 μm, more preferably 10 nm to 10 μm, still more preferably 20 nm to 1 μm, and particularly preferably 25 nm to 500 nm.

The layer A may contain only one or two or more kinds of the fillers.

From the viewpoint of adhesiveness to the metal, it is preferable that a content of the filler in the layer A is smaller than a content of the filler in the layer B.

In addition, from the viewpoint of laser processing suitability and adhesiveness to the metal, the content of the filler in the layer A is preferably 10% by mass to 90% by mass and more preferably 30% by mass to 80% by mass with respect to the total mass of the layer A.

A content of a filler such as polyethylene and an olefin-based elastomer is, for example, preferably 50% by volume to 90% by volume, and more preferably 75% by volume to 85% by volume. In this case, the content of the filler in the layer A is preferably 55% by mass to 90% by mass, and more preferably 80% by mass to 85% by mass with respect to the total mass of the layer A.

—Other Additives—

The layer A may contain an additive other than the above-described components.

Known additives can be used as other additives. Specific examples of the other additives include a curing agent, a leveling agent, an antifoaming agent, an antioxidant, an ultraviolet absorbing agent, a flame retardant, and a colorant.

In addition, the layer A may contain other resins other than the above-described polymer and polymer particles as other additives.

Examples of other resins include thermoplastic resins such as polypropylene, polyamide, polyester, polyphenylene sulfide, polyether ketone, polycarbonate, polyethersulfone, polyphenylene ether and a modified product thereof, and polyetherimide; elastomers such as a copolymer of glycidyl methacrylate and polyethylene; and thermosetting resins such as a phenol resin, an epoxy resin, a polyimide resin, and a cyanate resin.

The total content of the other additives in the layer A is preferably 40% by mass or less, more preferably 10% by mass or less, and still more preferably 5 parts by mass or less with respect to the total mass of the layer A.

From the viewpoints of the dielectric loss tangent of the film and the adhesiveness to the metal, the average thickness of the layer A is preferably thicker than the average thickness of the layer B.

From the viewpoint of dielectric loss tangent of the film and adhesiveness to the metal, a value of TA/TB, which is a ratio of the average thickness TA of the layer A to the average thickness TB of the layer B, is preferably 0.8 to 10, more preferably 1 to 5, still more preferably more than 1 and 3 or less, and particularly preferably more than 1 and 2 or less.

In addition, the average thickness of the layer A is not particularly limited, but from the viewpoint of dielectric loss tangent of the film and adhesiveness to the metal, the average thickness thereof is preferably 5 μm to 90 μm, more preferably 10 μm to 70 μm, and particularly preferably 15 μm to 60 μm.

A method of measuring the average thickness of each layer in the film according to the embodiment of the present disclosure is as follows.

The thickness of each layer is evaluated by cutting the film with a microtome and observing the cross section with an optical microscope. Three or more sites of the cross-sectional sample are cut out, the thickness is measured at three or more points in each cross section, and the average value thereof is defined as the average thickness.

<Layer B>

The film according to the embodiment of the present disclosure includes a layer B on at least one surface of the layer A.

From the viewpoints of the dielectric loss tangent of the film, the laser processing suitability, and the level difference followability, the dielectric loss tangent of the layer B is preferably 0.01 or less, more preferably 0.005 or less, still more preferably 0.004 or less, and particularly preferably 0.003 or less. The lower limit values of both cases are not particularly set, and examples thereof include a value of more than 0.

From the viewpoint of the dielectric loss tangent of the film and the laser processing suitability, the layer B preferably contains a polymer having a dielectric loss tangent of 0.01 or less.

In addition, from the viewpoint of the dielectric loss tangent of the film and the laser processing suitability, the layer B preferably contains a polymer having an aromatic ring, and more preferably contains a polymer having an aromatic ring and having a dielectric loss tangent of 0.01 or less.

Further, from the viewpoints of the dielectric loss tangent of the film, the laser processing suitability, and the level difference followability, the layer B preferably contains a polymer and polymer particles, and more preferably contains a polymer and particles of a polymer having a dielectric loss tangent of 0.01 or less or a polymer having a dielectric loss tangent of 0.01 or less and polymer particles.

The preferred aspect of the polymer having a dielectric loss tangent of 0.01 or less, which is used for the layer B, is the same as the preferred aspect of the polymer having a dielectric loss tangent of 0.01 or less, which is used for the layer A, except as described later.

The polymer having a dielectric loss tangent of 0.01 or less, which is contained in the layer B, may be the same as or different from the polymer having a dielectric loss tangent of 0.01 or less, which is contained in the layer A, but from the viewpoint of the adhesiveness between the layer A and the layer B and the laser processing suitability, the layer B preferably contains the same polymer as the polymer having a dielectric loss tangent of 0.01 or less, which is contained in the layer A.

The layer B may contain only one kind of polymer having a dielectric loss tangent of 0.01 or less, or may contain two or more kinds thereof.

A content proportion of the polymer having a dielectric loss tangent of 0.01 or less in the layer B is preferably equal to or larger than a content proportion of the polymer having a dielectric loss tangent of 0.01 or less in the layer A.

From the viewpoints of the dielectric loss tangent of the film, the laser processing suitability, and the adhesiveness to the metal, the content of the polymer having a dielectric loss tangent of 0.01 or less in the layer B is preferably 20% by mass to 100% by mass, more preferably 30% by mass to 100% by mass, and particularly preferably 40% by mass to 100% by mass with respect to the total mass of the layer B.

In addition, the layer B may contain a polymer other than the polymer having a dielectric loss tangent of 0.01 or less as a binder polymer.

From the viewpoints of the dielectric loss tangent, the laser processing suitability, and the level difference followability of the film, preferred examples of the other polymer include a thermoplastic resin including a thermoplastic elastomer. The elastomer refers to a polymer compound exhibiting elastic deformation. That is, the elastomer corresponds to a polymer compound having a property of being deformed according to an external force in a case where the external force is applied and of being recovered to an original shape in a short time in a case where the external force is removed.

Examples of the thermoplastic resin include a polyurethane resin, a polyester resin, a (meth)acrylic resin, a polystyrene resin, a fluororesin, a polyimide resin, a fluorinated polyimide resin, a polyamide resin, a polyamideimide resin, a polyether imide resin, a cellulose acylate resin, a polyurethane resin, a polyether ether ketone resin, a polycarbonate resin, a polyolefin resin (for example, a polyethylene resin, a polypropylene resin, a resin consisting of a cyclic olefin copolymer, and an alicyclic polyolefin resin), a polyarylate resin, a polyether sulfone resin, a polysulfone resin, a fluorene ring-modified polycarbonate resin, an alicyclic ring-modified polycarbonate resin, and a fluorene ring-modified polyester resin.

The thermoplastic elastomer is not particularly limited, and examples thereof include an elastomer including a constitutional repeating unit derived from styrene (polystyrene-based elastomer), a polyester-based elastomer, a polyolefin-based elastomer, a polyurethane-based elastomer, a polyamide-based elastomer, a polyacrylic elastomer, a silicone-based elastomer, and a polyimide-based elastomer. The thermoplastic elastomer may be a hydride.

Examples the polystyrene-based elastomer include a styrene-butadiene-styrene block copolymer (SBS), a styrene-isoprene-styrene block copolymer (SIS), a polystyrene-poly(ethylene-propylene) diblock copolymer (SEP), a polystyrene-poly(ethylene-propylene)-polystyrene triblock copolymer (SEPS), a styrene-ethylene-butylene-styrene block copolymer (SEBS), a polystyrene-poly(ethylene/ethylene-propylene)-polystyrene triblock copolymer (SEEPS), and hydrides thereof.

Among these, from the viewpoint of the dielectric loss tangent of the film, the laser processing suitability, and the level difference followability, the layer B preferably contains, as other polymers, a thermoplastic resin having an aromatic hydrocarbon group-containing constitutional unit, more preferably contains a polystyrene-based elastomer, and particularly preferably contains a hydrogenated styrene-ethylene-butylene-styrene block copolymer.

In addition, as the other polymer, a hydrogenated polystyrene-based elastomer is preferable from the viewpoints of the dielectric loss tangent of the film, the laser processing suitability, the adhesiveness to the copper foil, and the level difference followability.

The content of the other polymer than the liquid crystal polymer is not particularly limited, but from the viewpoints of the dielectric loss tangent of the film, the laser processing suitability, and the adhesiveness to the metal, the content is preferably 10% by mass to 100% by mass, more preferably 10% by mass to 70% by mass, and particularly preferably 10% by mass to 60% by mass with respect to the total mass of the layer B.

From the viewpoints of the dielectric loss tangent of the film, the laser processing suitability, and the level difference followability, it is preferable that the layer B includes a filler, and it is more preferable that the layer B includes polymer particles.

Preferred aspects of the filler which is used in the layer B are the same as the preferred aspects of the filler which is used in the layer A, except as described below.

In addition, as the filler used in the layer B, the particles of the above-described thermoplastic resin are also preferably mentioned.

Further, from the viewpoints of the dielectric loss tangent of the film, the laser processing suitability, and the level difference followability, at least one of the binder polymer or the filler contained in the layer B is preferably a polymer having a dielectric loss tangent of 0.01 or less, and more preferably a liquid crystal polymer.

In addition, from the viewpoints of the dielectric loss tangent of the film, the laser processing suitability, and the level difference followability, the layer B preferably contains a compound having a weight-average molecular weight of 5,000 or more and an absorbance at a wavelength of 355 nm of 80% or more, and more preferably contains a polymer having a weight-average molecular weight of 5,000 or more and an absorbance at a wavelength of 355 nm of 80% or more, in which the dielectric loss tangent is 0.01 or less, or a polymer particle having a weight-average molecular weight of 5,000 or more and an absorbance at a wavelength of 355 nm of 80% or more, in which the dielectric loss tangent is 0.01 or less.

Further, from the viewpoints of the dielectric loss tangent of the film, the laser processing suitability, and the level difference followability, it is preferable that the layer B contains crosslinked resin particles as a filler.

The crosslinked resin in the crosslinked resin particles is not particularly limited, and a known crosslinked resin can be used. For example, the crosslinked resin may be a crosslinked resin obtained by using a crosslinking agent during polymerization or a crosslinked resin obtained by reacting a crosslinking agent with a resin.

Among these, as the crosslinked resin particles, from the viewpoints of the dielectric loss tangent of the film, the laser processing suitability, and the level difference followability, the thermoplastic elastomer particles are preferable, polystyrene-based elastomer particles are more preferable, and hydrogenated polystyrene-based elastomer is particularly preferable.

The layer B may contain only one or two or more kinds of the fillers.

In addition, from the viewpoints of the dielectric loss tangent of the film, the laser processing suitability, and the level difference followability, the content of the filler in the layer B is preferably 10% by mass to 95% by mass, more preferably 20% by mass to 95% by mass, and particularly preferably 50% by mass to 90% by mass with respect to the total mass of the layer B.

In addition, from the viewpoint of preparing an absorbance at a wavelength of 355 nm and the viewpoint of laser processing suitability, the layer B preferably contains an ultraviolet absorbing agent (also referred to as a "UV absorber").

Examples of the UV absorber include a benzophenone-based UV absorber, a benzotriazole-based UV absorber, a benzoate-based UV absorber, a salicylate-based UV absorber, a triazine-based UV absorber, and a cyanoacrylate-based UV absorber.

From the viewpoint of preparing an absorbance at a wavelength of 355 nm and laser processing suitability, the UV absorber is preferably at least one kind of UV absorber selected from the group consisting of a benzotriazole-based UV absorber and a triazine-based UV absorber, and more preferably a triazine-based UV absorber.

Examples of benzotriazole-based UV absorber include 2-(2H-benzotriazol-2-yl)-p-cresol, 2-(2H-benzotriazol-2-yl)-4-6-bis(1-methyl-1-phenylethyl) phenol, 2-[5-chloro (2H)-benzotriazol-2-yl]-4-methyl-6-(tert-butyl) phenol, 2-(2H-benzotriazol-2-yl)-4,6-di-tert-pentylphenol, 2-(2H-benzotriazol-2-yl)-4-(1,1,3,3-tetramethylbutyl) phenol. The benzotriazole-based UV absorber may be a mixture, modified substance, polymerized substance, or derivative of the above compounds.

Examples of the triazine-based UV absorber include 2-(4,6-diphenyl-1,3,5-triazin-2-yl)-5-[(hexyl)oxy]-phenol, 2-[4-[(2-hydroxy-3-dodecyloxypropyl)oxy]-2-hydroxyphenyl]-4,6-bis(2,4-dimethylphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, and 2,4-bis(2,4-dimethylphenyl)-6-(2-hydroxy-4-isooctyloxyphenyl)-s-triazine. The triazine-based UV absorber may be a mixture, modified substance, polymerized substance, or derivative of the above compounds.

The layer B may contain only one kind of UV absorbing agent, or may contain two or more kinds of UV absorbing agents.

From the viewpoint of laser processing suitability, a content of the UV absorber is preferably 0.01% by mass to 5% by mass, more preferably 0.05% by mass to 3% by mass, and particularly preferably 0.1% by mass to 2% by mass with respect to the total mass of the layer B.

The layer B may contain an additive other than those described above.

Preferred aspects of other additives which are used in the layer B are the same as the preferred aspects of other additives which are used in the layer A, except as described below.

In addition, an average thickness of the layer B is not particularly limited, and from the viewpoints of the dielectric loss tangent of the film, the laser processing suitability, and the level difference followability, is preferably 1 μm to 90 μm, more preferably 5 μm to 60 μm, and particularly preferably 10 μm to 40 μm.

The film according to the embodiment of the present disclosure includes the layer B, and thus, a film having excellent adhesiveness to the metal can be obtained. For example, in a case where the layer A has a filler, it is presumed that, by including the layer B and the layer A brittle due to the addition of the filler, the surface of the film is improved, and effects such as improvement in adhesiveness are obtained.

In addition, the layer B is preferably a surface layer (outermost layer). For example, in a case where the film is used as a laminate (laminated plate with a metal layer) having a layer configuration of metal layer/layer A/layer B, another metal layer or laminated plate with a metal layer may be further disposed on the layer B side. In this case, interface destruction between the layer B and another metal layer in the laminate is suppressed, and the adhesiveness to the metal is improved.

In addition, it is preferable that the polymer contained in the layer B contains a polymer having a higher breaking strength (toughness) that the polymer contained in the layer A.

The breaking strength is measured by the following method.

A sample including the polymer to be measured is produced, and using a universal tensile tester "STM T50BP" manufactured by Toyo Baldwin Co., Ltd., a stress against elongation is measured at a tensile rate of 10%/min in an atmosphere of 25° C. and 60% RH to obtain the breaking strength.

<Layer C>

It is preferable that the film according to the embodiment of the present disclosure further includes a layer C, and from the viewpoint of adhesiveness to the metal, it is more preferable that the above-described layer B, the above-described layer A, and the layer C are provided in this order.

The layer C is preferably an adhesive layer.

In addition, in a case where a metal layer is present separately from each of the above-described layers, the layer C is preferably a surface layer (outermost layer).

From the viewpoint of the dielectric loss tangent of the film and the laser processing suitability, the layer C preferably contains a polymer having a dielectric loss tangent of 0.01 or less.

The preferred aspect of the polymer having a dielectric loss tangent of 0.01 or less, which is used for the layer C, is the same as the preferred aspect of the polymer having a dielectric loss tangent of 0.01 or less, which is used for the layer A, except as described later.

The liquid crystal polymer, which is contained in the layer C, may be the same as or different from the polymer having a dielectric loss tangent is 0.01 or less, which contained in the layer A or the layer B, but from the viewpoint of the adhesiveness between the layer A and the layer C, the layer C preferably contains the same polymer as the polymer having a dielectric loss tangent is 0.01 or less, which is contained in the layer A.

From the viewpoint of adhesiveness to the metal, the content of the polymer having a dielectric loss tangent of 0.01 or less in the layer C is preferably equal to or less than the content of the polymer having a dielectric loss tangent of 0.01 or less in the layer A.

From the viewpoints of the dielectric loss tangent of the film and the adhesiveness to the metal, the content of the polymer having a dielectric loss tangent of 0.01 or less in the layer B with respect to the total mass of the film is preferably 10% by mass to 99% by mass, more preferably 20% by mass to 95% by mass, still more preferably 30% by mass to 90% by mass, and particularly preferably 40% by mass to 80% by mass.

In addition, from the viewpoint of the dielectric loss tangent of the film and the laser processing suitability, the layer C preferably includes a polymer having an aromatic ring, and more preferably includes a polymer having an aromatic ring, and being a resin having an ester bond and an amide bond, and having a dielectric loss tangent of 0.01 or less.

In addition, the layer C preferably contains an epoxy resin since the metal layer and the resin layer (for example, the layer A) are adhered to each other.

The epoxy resin is preferably a crosslinked product of a polyfunctional epoxy compound. The polyfunctional epoxy compound refers to a compound having two or more epoxy groups. The number of epoxy groups in the polyfunctional epoxy compound is preferably 2 to 4.

Examples of the polyfunctional epoxy compound include a polyfunctional epoxy compound having a glycidyl ether group, a polyfunctional epoxy compound having a glycidyl ester group, and a polyfunctional epoxy compound having a glycidylamino group.

Examples of the polyfunctional epoxy compound having a glycidyl ether group include ethylene glycol diglycidyl ether, resorcinol diglycidyl ether, neopentyl glycol diglycidyl ether, 1,6-hexanediol diglycidyl ether, bisphenol A diglycidyl ether, trimethylolpropane polyglycidyl ether, polyglycerin polyglycidyl ether, glycerin polyglycidyl ether, pentaerythritol polyglycidyl ether, diglycerin polyglycidyl ether, sorbitol polyglycidyl ether, polybutadiene diglycidyl ether, diethylene glycol diglycidyl ether, polyethylene glycol diglycidyl ether, dipropylene glycol diglycidyl ether, and 1,4-butanediol diglycidyl ether.

Examples of the polyfunctional epoxy compound having a glycidyl ester group include a diglycidyl phthalate ester, a diglycidyl terephthalate ester, a diglycidyl hexahydrophthalate ester, and a diglycidyl dimerate.

Examples of the compound having a glycidylamino group include N,N,N',N'-tetraglycidyl-4,4'-diaminodiphenylmethane and 4,4'-methylenebis(N,N-diglycidylaniline).

Examples of the polyfunctional epoxy compound having a glycidyl ether group and a glycidylamino group include N,N-diglycidyl-4-glycidyloxyaniline.

Among these, from the viewpoint of the curing properties and an interaction with the metal surface, the epoxy resin is preferably a crosslinked product of a polyfunctional epoxy compound having a glycidylamino group, and more preferably at least one crosslinked product selected from the group consisting of N,N-diglycidyl-4-glycidyloxyaniline and N,N,N',N'-tetraglycidyl-4,4'-diaminodiphenylmethane.

In particular, from the viewpoints of the dielectric loss tangent of the film, the laser processing suitability, and the adhesiveness to the metal layer, it is preferable that the layer C contains aromatic polyester amide and an epoxy resin.

The layer C may contain a filler.

Preferred aspects of the filler which is used in the layer C are the same as the preferred aspects of the filler which is used in the layer B, except as described below.

The content of the filler in the layer C is not particularly limited and can be arbitrarily set.

In a case where the metal layers are provided on both surfaces of the film, from the viewpoint of adhesiveness to the metal, the content of the filler in the layer A is preferably lower than the content of the filler in the film.

In addition, in the case where metal layers are provided on both surfaces of the film, from the viewpoint of adhesiveness to the metal, it is preferable that the layer C does not contain the filler or the content of the filler in the layer C is more than 0% by volume and 20% by volume or less with respect to the total volume of the layer C; it is more preferable that the layer C does not contain the filler or the content of the filler in the layer C is more than 0% by volume and 10% by volume or less with respect to the total volume of the layer C; it is still more preferable that the layer C does not contain the filler or the content of the filler in the layer C is more than 0% by volume and 5% by volume or less with respect to the total volume of the layer C; and it is particularly preferable that the layer C does not contain the filler.

The content of the filler in the layer C is preferably 0% by mass to 15% by mass, and more preferably 0% by mass to 5% by mass with respect to the total mass of the layer C.

A content of a filler such as polyethylene and an olefin-based elastomer is, for example, preferably 50% by volume to 90% by volume, and more preferably 75% by volume to 85% by volume. In this case, the content of the filler in the layer C is preferably 55% by mass to 90% by mass, and more preferably 80% by mass to 85% by mass with respect to the total mass of the layer C.

The layer C may contain an additive other than those described above.

Preferred aspects of other additives which are used in the layer C are the same as the preferred aspects of other additives which are used in the layer A, except as described below.

From the viewpoint of dielectric loss tangent of the film and adhesiveness to the metal, it is preferable that an average thickness of the layer C is smaller than an average thickness of the layer A.

From the viewpoint of dielectric loss tangent of the film and adhesiveness to the metal, a value of TA/TC, which is a ratio of the average thickness TA of the layer A to an average thickness TC of the layer C, is preferably more than 1, more preferably 2 to 100, still more preferably 2.5 to 20, and particularly preferably 3 to 10.

From the viewpoint of dielectric loss tangent of the film and adhesiveness to the metal, a value of TB/TC, which is a ratio of the average thickness TB of the layer B to the average thickness TC of the layer C, is preferably more than 1, more preferably 2 to 100, still more preferably 2.5 to 20, and particularly preferably 3 to 10.

Furthermore, from the viewpoint of dielectric loss tangent of the film and adhesiveness to the metal, the average thickness of the layer C is preferably 0.1 μm to 20 μm, more preferably 0.5 µm to 15 µm, still more preferably 1 µm to 10 µm, and particularly preferably 3 µm to 8 µm.

From the viewpoint of strength and electrical characteristics (characteristic impedance) in a case of being laminated with the metal layer, an average thickness of the film according to the embodiment of the present disclosure is preferably 6 µm to 200 µm, more preferably 12 µm to 100 µm, and particularly preferably 20 µm to 60 µm.

The average thickness of the film is measured at optional five sites using an adhesive film thickness meter, for example, an electronic micrometer (product name, "KG3001A", manufactured by Anritsu Corporation), and the average value of the measured values is defined as the average thickness of the film.

<Method of Manufacturing Film>

[Film Formation]

A method of manufacturing the film according to the embodiment of the present disclosure is not particularly limited, and a known method can be referred to.

Suitable examples of the method of manufacturing the film according to the embodiment of the present disclosure include a co-casting method, a multilayer coating method, and a co-extrusion method. Among these, the co-casting method is particularly preferable for formation of a relatively thin film, and the co-extrusion method is particularly preferable for formation of a thick film.

In a case of being manufactured by the co-casting method and the multilayer coating method, it is preferable to perform the co-casting method or the multilayer coating method as a composition for forming a layer A, a composition for forming a layer B, a composition for forming a layer C, or the like, in which the components of each layer such as a polymer having a dielectric loss tangent of 0.01 or less are dissolved or dispersed in a solvent.

Examples of the solvent include halogenated hydrocarbons such as dichloromethane, chloroform, 1,1-dichloroethane, 1,2-dichloroethane, 1,1,2,2-tetrachloroethane, 1-chlorobutane, chlorobenzene, and o-dichlorobenzene; halogenated phenols such as p-chlorophenol, pentachlorophenol, and pentafluorophenol; ethers such as diethyl ether, tetrahydrofuran, and 1,4-dioxane; ketones such as acetone and cyclohexanone; esters such as ethyl acetate and γ-butyrolactone; carbonates such as ethylene carbonate and propylene carbonate; amines such as triethylamine; nitrogen-containing heterocyclic aromatic compounds such as pyridine; nitriles such as acetonitrile and succinonitrile; amides such as N,N-dimethylformamide, N,N-dimethylacetamide, and N-methylpyrrolidone; urea compounds such as tetramethylurea; nitro compounds such as nitromethane and nitrobenzene; sulfur compounds such as dimethyl sulfoxide and sulfolane; and phosphorus compounds such as hexamethylphosphoramide and tri-n-butyl phosphate. Among these, two or more kinds thereof may be used in combination.

The solvent preferably contains an aprotic compound (particularly, an aprotic compound having no halogen atom) for low corrosiveness and easiness to handle. A proportion of the aprotic compound to the whole solvent is preferably 50% by mass to 100% by mass, more preferably 70% by mass to 100% by mass, and particularly preferably 90% by mass to 100% by mass. In addition, from the viewpoint of easily dissolving the liquid crystal polymer, as the above-described aprotic compound, it is preferable to contain an amide such as N,N-dimethylformamide, N,N-dimethylacetamide, tetramethylurea, and N-methylpyrrolidone, or an ester such as γ-butyrolactone; and it is more preferable to contain N,N-dimethylformamide, N,N-dimethylacetamide, or N-methylpyrrolidone.

In addition, as the solvent, it is preferable to contain a compound having a dipole moment of 3 to 5, because the above-described polymer such as the liquid crystal polymer can be easily dissolved. A proportion of the compound having a dipole moment of 3 to 5 to the whole solvent is preferably 50% by mass to 100% by mass, more preferably 70% by mass to 100% by mass, and particularly preferably 90% by mass to 100% by mass.

It is preferable to use the compound having a dipole moment of 3 to 5 as the above-described aprotic compound.

In addition, as the solvent, it is preferable to contain a compound having a boiling point of 220° C. or lower at 1 atm, because the solvent is easily removed. A proportion of the compound having a boiling point of 220° C. or lower at 1 atm to the whole solvent is preferably 50% by mass to 100% by mass, more preferably 70% by mass to 100% by mass, and particularly preferably 90% by mass to 100% by mass.

It is preferable to use the compound having a boiling point of 220° C. or lower at 1 atm as the above-described aprotic compound.

In addition, in a case where the film is manufactured by a manufacturing method such as the co-casting method, the multilayer coating method, the co-extrusion method, or the like described above, a support may be used in the method of manufacturing the film according to the embodiment of the present disclosure. In addition, in a case where the metal layer (metal foil) or the like used in the laminate described later is used as the support, the support may be used as it is without being peeled off.

Examples of the support include a metal drum, a metal band, a glass plate, a resin film, and a metal foil. Among these, a metal drum, a metal band, or a resin film is preferable.

Examples of the resin film include a polyimide (PI) film, and examples of commercially available products thereof include U-PILEX S and U-PILEX R (manufactured by Ube Corporation), KAPTON (manufactured by Du Pont-Toray Co., Ltd.), and IF30, IF70, and LV300 (manufactured by SKC Kolon PI, Inc.).

In addition, the support may have a surface treatment layer formed on the surface so that the support can be easily peeled off. Hard chrome plating, a fluororesin, or the like can be used as the surface treatment layer.

An average thickness of the support is not particularly limited, but is preferably 25 µm or more and 75 µm or less and more preferably 50 µm or more and 75 µm or less.

In addition, a method for removing at least a part of the solvent from a cast or applied film-like composition (a casting film or a coating film) is not particularly limited, and a known drying method can be used.

[Stretching]

In the film according to the embodiment of the present disclosure, stretching can be combined as appropriate from the viewpoint of controlling molecular alignment and adjusting linear expansion coefficient and mechanical properties. The stretching method is not particularly limited, and a known method can be referred to, and the stretching method may be carried out in a solvent-containing state or in a dry film state. The stretching in the solvent-containing state may be carried out by gripping and stretching the film, or may be carried out by utilizing self-contraction due to drying without stretching. The stretching is particularly effective for the purpose of improving the breaking elongation and the breaking strength, in a case where brittleness of the film is reduced by addition of an inorganic filler or the like.

In addition, the method of producing a film according to the embodiment of the present disclosure may include a step of polymerizing the film by light or heat, as necessary.

A light irradiation unit and a heat application unit are not particularly limited, and a known light irradiation unit such as a metal halide lamp and a known heat application unit such as a heater can be used.

Light irradiation conditions and heat application conditions are not particularly limited, and the polymerization can be carried out at a desired temperature and time and in a known atmosphere.

[Heat Treatment]

The method of producing a film according to the embodiment of the present disclosure preferably includes a step of subjecting the film to a heat treatment (annealing).

Specifically, from the viewpoint of dielectric loss tangent and peel strength, the heat treatment temperature in the above-described step of heat-treating is preferably 260° C. to 370° C., more preferably 280° C. to 360° C., and still more preferably 300° C. to 350° C. The heat treatment time is preferably 15 minutes to 10 hours and more preferably 30 minutes to 5 hours.

In addition, the method of manufacturing the film according to the embodiment of the present disclosure may include other known steps as necessary.

<Applications>

The film according to the embodiment of the present disclosure can be used for various applications. Among the various applications, the film can be used suitably as a film for an electronic component such as a printed wiring board and more suitably for a flexible printed circuit board.

In addition, the film according to the embodiment of the present disclosure can be suitably used as a metal adhesive film.

(Laminate)

The laminate according to the embodiment of the present disclosure may be a laminate in which the film according to the embodiment of the present disclosure is laminated, but is preferably a laminate having the film according to the embodiment of the present disclosure and a metal layer or a metal wire disposed on at least one surface of the film.

In addition, it is preferable that the laminate according to the embodiment of the present disclosure includes a metal layer or a metal wire on a B layer side of the film, in which a dielectric loss tangent of the film is 0.010 or less, and a ratio of an absorbance of the layer B at a wavelength of 355 nm to an absorbance of the layer A at a wavelength of 355 nm is 0.45 or more and 1.00 or less.

In addition, it is preferable that the laminate according to the embodiment of the present disclosure includes the film according to the embodiment of the present disclosure and a metal layer disposed on a surface of the above-described layer B side of the film, and it is more preferable that the metal layer is a copper layer.

The metal layer disposed on the surface of the above-described layer B side is preferably a metal layer disposed on the surface of the above-described layer B.

In addition, it is preferable that the laminate according to the embodiment of the present disclosure includes the film according to the embodiment of the present disclosure in which the layer B, the layer A, and the layer C are provided in this order, a metal layer disposed on a surface of the above-described layer B side of the film, and a metal layer disposed on a surface of the above-described layer C side of the film; and it is more preferable that both of the metal layers are copper layers.

It is preferable that the metal layer disposed on the surface of the above-described layer C side is a metal layer disposed on the surface of the above-described layer C, and it is more preferable that the metal layer disposed on the surface of the above-described layer B side is a metal layer disposed on the surface of the above-described layer B, and the metal layer disposed on the surface of the above-described layer C side is a metal layer disposed on the surface of the above-described layer C.

In addition, the metal layer disposed on the surface of the above-described layer B side and the metal layer disposed on the surface of the above-described layer C side may be a metal layer having the same material, thickness, and shape, or may be metal layers having different materials, thicknesses, and shapes. From the viewpoint of adjusting the characteristic impedance, the metal layer disposed on the surface of the above-described layer B side and the metal layer disposed on the surface of the above-described layer C side may be metal layers having different materials or thicknesses, or a metal layer may be laminated on only one side of the layer B or the layer C.

Furthermore, from the viewpoint of adjusting the characteristic impedance, preferred examples thereof also include an aspect in which a metal layer is laminated on one side of the layer B or the layer C, and another film is laminated on the other side.

A method of attaching the film according to the embodiment of the present disclosure to the metal layer is not particularly limited, and a known laminating method can be used.

In a case where the above-described metal layer is the above-described copper layer, a peel strength between the above-described film and the above-described copper layer is preferably 0.5 kN/m or more, more preferably 0.7 kN/m or more, still more preferably 0.7 kN/m to 2.0 KN/m, and particularly preferably 0.9 kN/m to 1.5 kN/m.

In the present disclosure, the peeling strength between the film and the metal layer (for example, the copper layer) is measured by the following method.

A peeling test piece with a width of 1.0 cm is produced from the laminate of the film and the metal layer, the film is fixed to a flat plate with double-sided adhesive tape, and the strength (kN/m) in a case of peeling the film off from the metal layer at a rate of 50 mm/min is measured by the 180° method in conformity with JIS C 5016 (1994).

From the viewpoint of reducing transmission loss of high-frequency signal, a surface roughness Rz of the above-described metal layer on the side in contact with the above-described film is preferably less than 1 μm, more preferably 0.5 μm or less, and particularly preferably 0.3 μm or less.

Since it is preferable that the surface roughness Rz of the above-described metal layer is as small as possible, the lower limit value thereof is not particularly set, but may be, for example, 0 or more.

The "surface roughness Rz" in the present disclosure refers to a value expressed in micrometer, which is the total value of the maximum value of height of peak and the maximum value of depth of valley observed on a roughness curve over the reference length.

In the present disclosure, the surface roughness Rz of the metal layer (for example, the copper layer) is measured by the following method.

Using a noncontact surface/layer cross-sectional shape measurement system VertScan (manufactured by MITSUBI- SHI CHEMICAL SYSTEMS, Inc.), a square of 465.48 µm in length and 620.64 µm in width is measured to create a roughness curve on the surface of the measurement object (metal layer) and create an average line of the roughness curve. A portion corresponding to the reference length is extracted from the roughness curve. The surface roughness Rz of the measurement object is measured by obtaining the total value of the maximum value of height of peak (that is, height from the average line to summit) and the maximum value of depth of valley (that is, depth from the average line to valley bottom) observed in the extracted roughness curve.

The metal layer is preferably a copper layer. As the copper layer, a rolled copper foil formed by a rolling method or an electrolytic copper foil formed by an electrolytic method is preferable.

An average thickness of the metal layer, preferably the copper layer, is not particularly limited, but is preferably 2 µm to 20 µm, more preferably 3 µm to 18 µm, and still more preferably 5 µm to 12 µm. The copper foil may be copper foil with a carrier formed on a support (carrier) so as to be peelable. As the carrier, a known carrier can be used. An average thickness of the carrier is not particularly limited, but is preferably 10 µm to 100 µm and more preferably 18 µm to 50 µm.

In addition, from the viewpoint of further exerting the effects of the present disclosure, the above-described metal layer preferably has a known surface treatment layer (for example, a chemical treatment layer) on the surface of the side in contact with the film to ensure adhesion to the resin. In addition, the above-described interactable group is preferably a combination of groups capable of forming a covalent bond or the like, such as an amino group and an epoxy group, and a hydroxy group and an epoxy group.

Among these, from the viewpoint of adhesiveness and ease of performing a treatment, a covalent-bondable group is preferable, an amino group or a hydroxy group is more preferable, and an amino group is particularly preferable.

The metal layer in the laminate according to the embodiment of the present disclosure may be a metal layer having a circuit pattern.

It is also preferable that the metal layer in the laminate according to the embodiment of the present disclosure is processed into, for example, a desired circuit pattern by etching to form a flexible printed circuit board. The etching method is not particularly limited, and a known etching method can be used.

EXAMPLES

Hereinafter, the present disclosure will be described in more detail with reference to examples. The materials, the used amounts, the proportions, the treatment contents, the treatment procedures, and the like described in the following examples can be appropriately changed without departing from the gist of the present disclosure. Therefore, the scope of the present disclosure is not limited to the following specific examples.

<<Measurement Method>>

[Elastic Modulus at 160° C.]

First, the film was cut in cross section with a microtome or the like, and the layer A or the layer B was specified with an optical microscope. Next, the elastic modulus of the specified layer A or layer B was measured as an indentation elastic modulus using a nanoindentation method. The indentation elastic modulus was measured by using a microhardness tester (product name "DUH-W201", manufactured by Shimadzu Corporation) to apply a load at a loading rate of 0.28 mN/see with a Vickers indenter at 160° C., holding a maximum load of 10 mN for 10 seconds, and then unloading at a loading rate of 0.28 mN/sec.

[Absorbance Ratio at Wavelength of 355 nm]

First, a single-sided copper-clad laminated plate was cut in a cross section with a microtome to specify the cross sections of the layer A and the layer B. The cross section is subjected to cutting processing so that the optical path length is equal to the film thickness of each layer, and the total light transmittance and the reflectivity of light having a wavelength of 355 nm are measured using a microspectrophotometer. The absorption rate was calculated by the following calculation expression.

Absorbance (%)=100−Total light transmittance (%)−Reflectivity (%)

From the absorbance of the layer A and the absorbance of the layer B obtained above, the value of the absorbance of the layer B/the absorbance of the layer A was calculated.

<<Production Example>>

<Polymer or Polymer Particles>

P1: aromatic polyester amide (liquid crystal polymer) produced by the production method described below —Synthesis of Aromatic Polyester Amide P1—

940.9 g (5.0 mol) of 6-hydroxy-2-naphthoic acid, 415.3 g (2.5 mol) of isophthalic acid, 377.9 g (2.5 mol) of acetaminophen, 867.8 g (8.4 mol) of acetic anhydride are put in a reactor comprising a stirring device, a torque meter, a nitrogen gas introduction pipe, a thermometer, and a reflux condenser, gas in the reactor is substituted with nitrogen gas, a temperature increases from a room temperature (23° C., the same applies hereinafter) to 140° C. over 60 minutes while stirring under a nitrogen gas flow, and refluxing is performed at 140° C. for three hours.

Next, the temperature increases from 150° C. to 300° C. over five hours while by-produced acetic acid and unreacted acetic anhydride are distilled and is maintained at 300° C. for 30 minutes. Thereafter, a content is taken out from the reactor and is cooled to the room temperature. An obtained solid is ground by a grinder, and powdered aromatic polyester amide A1a is obtained. A flow start temperature of aromatic polyester amide A1a is 193° C. Aromatic polyester amide A1a is fully aromatic polyester amide.

Aromatic polyester amide A1a is subjected to solid polymerization by increasing the temperature from the room temperature to 160° C. over two hours and 20 minutes, next increasing the temperature from 160° C. to 180° C. over three hours and 20 minutes, and maintaining the temperature at 180° C. for five hours under a nitrogen atmosphere, and then, is cooled. Next, aromatic polyester amide A1a is pulverized by a pulverizer, and powdered aromatic polyester amide A1b is obtained. A flow start temperature of aromatic polyester amide A1b is 220° C.

Aromatic polyester amide A1b is subjected to solid polymerization by increasing the temperature from the room temperature to 180° C. for one hour and 25 minutes, next increasing the temperature from 180° C. to 255° C. over six hours and 40 minutes, and maintaining the temperature at 255° C. for five hours under a nitrogen atmosphere, and then, is cooled, and powdered aromatic polyester amide P1 is obtained.

A flow start temperature of aromatic polyester amide PI is 302° C. A melting point of aromatic polyester amide P1 is measured using a differential scanning calorimetry apparatus, and is 311° C. Solubility of aromatic polyester amide PI with respect to N-methylpyrrolidone at 140° C. is equal to or greater than 1% by mass.

PP-1: liquid crystal polymer particles produced by production method described below —Preparation of Liquid Crystal Polymer Particles PP-1—

1034.99 g (5.5 mol) of 2-hydroxy-6-naphthoic acid, 89.18 g (0.41 mol) of 2,6-naphthalenedicarboxylic acid, 236.06 g (1.42 mol) of terephthalic acid, 341.39 g (1.83 mol) of 4,4-dihydroxybiphenyl, and potassium acetate and magnesium acetate as a catalyst are put in a reactor comprising a stirring device, a torque meter, a nitrogen gas introduction pipe, a thermometer, and a reflux condenser. Gas in the reactor is substituted with nitrogen gas, and then, acetic anhydride (1.08 molar equivalent with respect to a hydroxyl group) is further added. A temperature increases from a room temperature to 150° C. over 15 minutes while stirring under a nitrogen gas flow, and refluxing is performed at 150° C. for two hours.

Next, the temperature increases from 150° C. to 310° C. over five hours while by-produced acetic acid and unreacted acetic anhydride are distilled, and a polymerized substance is taken out and is cooled to the room temperature. An obtained polymerized substance increases in temperature from the room temperature to 295° C. over 14 hours, and is subjected to solid polymerization at 295° C. for one hour. After the solid polymerization, the temperature was lowered to room temperature over 5 hours, thereby obtaining liquid crystal polymer particles PP-1. The liquid crystal polymer particles PP-1 has a median diameter (D50) of 7 μm, a dielectric loss tangent of 0.0007, and a melting point of 334° C.

P2: TAFTEC M1913, manufactured by Asahi Kasei Corporation, hydrogenated styrene-ethylene-butylene-styrene block copolymer, Mw=100,000, Mw/Mn=5.3, absorbance at a wavelength of 355 nm=1%

PP-2: TAFTEC M1913, manufactured by Asahi Kasei Chemicals Corporation, frozen and pulverized product (average particle diameter 5.0 μm (D50))

Polyimide: PIAD-100H, manufactured by Arakawa Chemical Industries, Ltd., thermoplastic polyimide varnish <Additive>

C1: curing agent, jERYX8800, manufactured by Mitsubishi Chemical Corporation, condensed polycyclic epoxy resin C2: curing agent, EPICLON HP4032D, manufactured by DIC Corporation, condensed polycyclic epoxy resin A1: Silica particles, SC2050-MB, manufactured by Admatechs Co., Ltd., particle diameter 0.5 μm A2: Tinuvin 400, manufactured by BASF SE, triazine-based UV absorber, molecular weight 647

Examples 1 to 4 and Comparative Examples 1 to 3

—Preparation of Coating Liquid for Undercoat Layer—

8 parts of aromatic polyester amide P1 was added to 92 parts of N-methylpyrrolidone, and the mixture was stirred at 140° C. for 4 hours under a nitrogen atmosphere to obtain an aromatic polyester amide solution PI (concentration of solid contents: 8% by mass).

An aminophenol type epoxy resin ("jER630" manufactured by Mitsubishi Chemical Corporation, 0.04 parts by mass) was mixed with the aromatic polyester amide solution P1 (10.0 parts by mass) to prepare an undercoat layer coating liquid.

—Preparation of Coating Liquid for a Layer—

The polymer and the polymer particles shown in Table 1 were mixed in the ratio of parts by mass shown in Table 1, N-methylpyrrolidone was added thereto to adjust the concentration of solid contents to be 25% by mass, and a coating liquid for an A layer was obtained.

—Preparation of Coating Liquid for B Layer—

The polymer, the polymer particles, the curing agent, and the additive shown in Table 1 were mixed in the ratio of parts by mass shown in Table 1, N-methylpyrrolidone was added thereto to adjust the concentration of solid contents to be 20% by mass, and a coating liquid for a B layer was obtained.

—Preparation of Single-Sided Copper-Clad Laminated Plate—

The obtained undercoat layer coating liquid, A layer coating liquid, and B layer coating liquid were fed to a slot die coater equipped with a slide coater, and the flow rate was adjusted so that the film thicknesses described in Table 1 were obtained on a surface of a copper foil (manufactured by Fukuda Metal Foil & Powder Co., Ltd., CF-T4X-SV-18, thickness: 18 μm, surface roughness Rz of a pasting surface (treated surface): 0.85 μm), and coating was performed in a 3-layer configuration (undercoat layer/A layer/B layer). The coating film was dried at 40° C. for 4 hours to remove the solvent from the coating film. Thereafter, the temperature was raised from room temperature to 300° C. at 1° C./min under a nitrogen atmosphere, and a heat treatment was performed at the temperature for 2 hours to obtain a polymer film (single-sided copper-clad laminated plate) having a copper layer.

<<Evaluation>>

The produced films were evaluated by the following methods, and the results are shown in Table 2.

[Dielectric Loss Tangent]

The dielectric loss tangent was measured by a resonance perturbation method at a frequency of 10 GHz. A 10 GHz cavity resonator (CP531 manufactured by KANTO Electronic Application and Development Inc.) is connected to a network analyzer ("E8363B" manufactured by Agilent Technology Co., Ltd.), the test piece is inserted into the cavity resonator, and the dielectric loss tangent of the film is measured from change in resonance frequency before and after insertion for 96 hours under an environment of a temperature of 25° C. and humidity of 60% RH.

[Level Difference Followability (Wiring Line Followability)]

(1) Production of Sample

—Production of Base Material with Wiring Pattern—

A copper foil (product name "CF-T4X-SV-18", average thickness: 18 μm, manufactured by Fukuda Metal Foil & Powder Co., Ltd.) and a liquid crystal polymer film (product name "CTQ-50", average thickness: 50 μm, manufactured by Kuraray Co., Ltd.) as a base material were produced. The copper foil, the base material, and the copper foil were laminated in this order such that the treated surface of the copper foil was in contact with the base material. A double-sided copper foil laminated plate precursor was obtained by performing a laminating treatment for 1 minute under conditions of 140° C. and a laminating pressure of 0.4 MPa using a laminator (product name "Vacuum Laminator V-130", manufactured by Nikko-Materials Co., Ltd.). Subsequently, using a thermal compression machine (product name "MP-SNL", manufactured by toyo Seiki Seisaku-sho, Ltd.), the obtained double-sided copper-clad laminated plate precursor was thermal compression-bonded under conditions of 300° C. and a pressure of 4.5 MPa for 10 minutes to prepare a double-sided copper-clad laminated plate.

Each of the copper foils on both surfaces of the above-described double-sided copper-clad laminated plate was etched to perform patterning, and a base material with wiring patterns including a ground line and three pairs of signal lines on both sides of the base material was produced. A length of the signal line was 50 mm, and a width of the signal line was set such that characteristic impedance was 50Ω.
—Production of Wiring Board—
The base material with wiring patterns produced above was overlaid on the B layer side of the produced single-sided copper-clad laminated plate, and subjected to a heat press for 1 hour under the conditions of 160° C. and 4 MPa to obtain a wiring board.
In the obtained wiring board, the wiring patterns (the ground line and the signal line) were embedded, and the thickness of the wiring patterns was 18 μm.
(2) Measuring Method
The wiring board was cut along the thickness direction with a microtome, and a cross section was observed with an optical microscope. A length L of a gap generated between the resin layer and the wiring pattern in an in-plane direction was measured. The average value of the results at 10 points was calculated. The evaluation standards are as follows.
A: L is less than 2 μm.
B: L is 2 μm or more.
[Laser Processing Suitability]
(1) Production of Sample
The treated surface of a copper foil (product name "CF-T4X-SV-18", average thickness of 18 μm, manufactured by Fukuda Metal Foil & Powder Co., Ltd.) was superimposed on the B-layer surface side of the prepared single-sided copper-clad laminated plate. A double-sided copper foil laminated plate was obtained by performing a laminating treatment for 60 minutes under conditions of 160° C. and a laminating pressure of 4 MPa using a laminator (product name "Vacuum Laminator V-130", manufactured by Nikko-Materials Co., Ltd.).

(2) Measuring Method
Through-hole via holes were processed from the single-sided copper-clad laminated plate side of the double-sided copper-clad laminated plate using a UV-YAG laser Model 5330 manufactured by ESI. A cross section of the via portion was observed with an optical microscope, and the length of peeling of the layer A and the layer B (that is, the maximum length of the recess formed in the cross section of the cut portion in a horizontal direction) was measured, and this was used as an evaluation index of the laser processing suitability.
It can be evaluated that the shorter the length of the peeling of the layer A and the layer B, the more excellent the laser processing suitability. In addition, Table 2 shows the longer one of the lengths of the peeling of the layer A and the layer B.
[Precipitation Suppression Property after Moisture-Heat Treatment]
(1) Moisture-Heat Treatment
The prepared single-sided copper-clad laminated plate was maintained at −60° C. for 15 minutes using a rapid temperature change chamber TCC-150 W manufactured by ESPEC Corp., and a heat cycle of raising the temperature to +130° C. and maintaining the temperature for 15 minutes was repeated 1,000 times.
(2) Evaluation Method
A surface of the B layer of the sample after the moisture-heat treatment was visually checked, and the precipitation of the resin material was confirmed. Evaluation criteria are as follows.
A: No precipitation is observed on the surface.
B: Precipitation occurs on the surface.

TABLE 1

| | | Layer A | | | | | | | Layer B | | |
|---|---|---|---|---|---|---|---|---|---|---|---|
| | | Constitution | | | | | | | Constitution | | |
| | | Polymer | | Polymer particles | | Absorbance at wavelength of 355 nm | | | Polymer | | |
| | Undercoat layer Thickness (μm) | Type | Addition amount (part by mass) | Type | Addition amount (part by mass) | Elastic modulus MD$^{-4}$ at 160° C. (MPa) | | Dielectric loss tangent | Thickness (μm) | Type | Addition amount (part by mass) | Polymer particles Type |
| Comparative Example 1 | — | Polyimide | 100 | — | — | 3400 | 95% | 0.015 | 30 | P2 | 64 | — |
| Comparative Example 2 | 3 | P1 | 25 | PP-1 | 75 | 750 | 93% | 0.002 | 27 | P2 | 100 | — |
| Comparative Example 3 | 3 | P1 | 25 | PP-1 | 75 | 750 | 93% | 0.002 | 27 | P2 | 63.5 | — |
| Example 1 | 3 | P1 | 25 | PP-1 | 75 | 750 | 93% | 0.002 | 27 | P1 | 15 | PP-2 |
| Example 2 | 3 | P1 | 25 | PP-1 | 75 | 750 | 93% | 0.002 | 27 | P1 | 35 | PP-2 |
| Example 3 | 3 | P1 | 25 | PP-1 | 75 | 750 | 93% | 0.002 | 27 | P2 | 85 | PP-1 |
| Example 4 | 3 | P1 | 25 | PP-1 | 75 | 750 | 93% | 0.002 | 27 | P2 | 63.7 | — |

TABLE 1-continued

| | Layer B | | | | | | | | | | |
|---|---|---|---|---|---|---|---|---|---|---|---|
| | Constitution | | | | | | | | | | |
| | Polymer particles | Curing agent | | Additive | | Additive | | | Absorbance at wavelength of 355 nm | Dielectric loss tangent | Thickness |
| | Addition amount (part by mass) | Type | Addition amount (part by mass) | Type | Addition amount (part by mass) | Type | Addition amount (part by mass) | Elastic modulus $MD^B$ at 160° C. (MPa) | | | |
| Comparative Example 1 | — | C1 | 4 | A1 | 32 | — | — | 3.00 | 40% | 0.001 | 25 |
| Comparative Example 2 | — | — | — | — | — | — | — | 1.70 | 1% | 0.001 | 25 |
| Comparative Example 3 | — | C2 | 4 | A1 | 32 | A2 | 0.8 | 3.00 | 95% | 0.001 | 25 |
| Example 1 | 85 | — | — | — | — | — | — | 2.20 | 91% | 0.002 | 25 |
| Example 2 | 65 | — | — | — | — | — | — | 4.40 | 91% | 0.002 | 25 |
| Example 3 | 15 | — | — | — | — | — | — | 2.10 | 91% | 0.002 | 25 |
| Example 4 | — | C2 | 4 | A1 | 32 | A2 | 0.3 | 3.00 | 50% | 0.001 | 25 |

TABLE 2

| | Evaluation result | | | | | |
|---|---|---|---|---|---|---|
| | Ratio of elastic modulus of layer A and layer B at 160° C. ($MD^A/MD^B$) | Ratio of UV absorbance (layer B/layer A) | Dielectric loss tangent of film | Level difference followability | Laser processing suitability (μm) | Precipitation suppression property after moisture-heat treatment |
| Comparative Example 1 | 1133 | 0.42 | 0.011 | A | 6 | A |
| Comparative Example 2 | 441 | 0.01 | 0.002 | A | 20 | A |
| Comparative Example 3 | 250 | 1.02 | 0.002 | A | 15 | B |
| Example 1 | 341 | 0.98 | 0.002 | A | 5 | A |
| Example 2 | 170 | 0.98 | 0.002 | A | 5 | A |
| Example 3 | 357 | 0.98 | 0.002 | A | 5 | A |
| Example 4 | 250 | 0.54 | 0.002 | A | 8 | B |

The "Ratio of UV absorption factor (B layer/A layer)" in Table 2 indicates a ratio of the UV absorption factor of the layer B at a wavelength of 355 nm to the UV absorption factor of the layer A at a wavelength of 355 nm.

From the results shown in Table 1 and Table 2, it is found that the films of Examples 1 to 4, which are films according to the embodiment of the present disclosure, have a lower dielectric loss tangent and are more excellent in laser processing suitability than the films of Comparative Examples 1 to 3.

In addition, from the results shown in Tables 1 and 2, the films of Examples 1 to 4, which are the films according to the embodiment of the present disclosure, are also excellent in level difference followability.

The disclosure of JP2022-060848 filed on Mar. 31, 2022 is incorporated herein by reference in its entirety.

All publications, patent applications, and technical standards described in the present specification are herein incorporated by reference to the same extent as in a case where each publication, each patent application, and each technical standard are specifically and individually indicated to be incorporated by reference.

What is claimed is:
1. A film comprising:
a layer A; and
a layer B provided on at least one surface of the layer A, wherein a dielectric loss tangent of the film is 0.010 or less, and
a ratio of an absorbance of the layer B at a wavelength of 355 nm to an absorbance of the layer A at the wavelength of 355 nm is 0.45 or more and 1.00 or less.
2. The film according to claim 1,
wherein a ratio of an elastic modulus of the layer A at 160° C. to an elastic modulus of the layer B at 160° C. is 1.2 or more.
3. The film according to claim 1,
wherein an elastic modulus of the layer B at 160° C. is 100 MPa or less.
4. The film according to claim 1,
wherein a dielectric loss tangent of the layer A is 0.01 or less.
5. The film according to claim 1,
wherein the layer A contains a liquid crystal polymer.
6. The film according to claim 1,
wherein the layer A contains aromatic polyester amide.

7. The film according to claim 1,
wherein a dielectric loss tangent of the layer B is 0.01 or less.

8. The film according to claim 1,
wherein the layer B contains a compound having a weight-average molecular weight of 5,000 or more and an absorbance of 80% or more at the wavelength of 355 nm.

9. The film according to claim 1,
wherein the layer B contains a liquid crystal polymer.

10. The film according to claim 1,
wherein the layer B contains aromatic polyester amide.

11. The film according to claim 1,
wherein the layer B contains a thermoplastic resin having a constitutional unit having an aromatic hydrocarbon group.

12. A laminate comprising:
the film according to claim 1; and
a metal layer or a metal wire disposed on at least one surface of the film.

13. A laminate comprising:
a film having a layer A and a layer B; and
a metal layer or a metal wire on a B layer side of the film,
wherein a dielectric loss tangent of the film is 0.010 or less, and
a ratio of an absorbance of the layer B at a wavelength of 355 nm to an absorbance of the layer A at the wavelength of 355 nm is 0.45 or more and 1.00 or less.

\* \* \* \* \*